US010972069B2

(12) United States Patent
Matsumoto

(10) Patent No.: US 10,972,069 B2
(45) Date of Patent: Apr. 6, 2021

(54) RADIO-FREQUENCY MODULE

(71) Applicant: Murata Manufacturing Co., Ltd., Kyoto (JP)

(72) Inventor: Naoya Matsumoto, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/809,879

(22) Filed: Mar. 5, 2020

(65) Prior Publication Data
US 2020/0204144 A1 Jun. 25, 2020

Related U.S. Application Data

(63) Continuation of application No. PCT/JP2018/030701, filed on Aug. 20, 2018.

(30) Foreign Application Priority Data

Sep. 7, 2017 (JP) .............................. JP2017-171733

(51) Int. Cl.
*H04B 1/40* (2015.01)
*H03H 7/38* (2006.01)
*H04B 1/525* (2015.01)

(52) U.S. Cl.
CPC ............... *H03H 7/38* (2013.01); *H04B 1/525* (2013.01)

(58) Field of Classification Search
CPC .......... H04B 1/04; H04B 1/0475; H04B 1/10; H04B 1/40; H04B 1/525; H04B 2011/0408
See application file for complete search history.

(56) References Cited

U.S. PATENT DOCUMENTS

2005/0136850 A1 6/2005 Arai
2008/0111631 A1 5/2008 Shiikuma
(Continued)

FOREIGN PATENT DOCUMENTS

JP 2005-184224 A 7/2005
JP 2008-124715 A 5/2008
(Continued)

OTHER PUBLICATIONS

International Search Report for International Application No. PCT/JP2018/030701, dated Sep. 18, 2018.
(Continued)

*Primary Examiner* — Blane J Jackson
(74) *Attorney, Agent, or Firm* — Pearne & Gordon LLP

(57) ABSTRACT

A substrate includes a conductor unit at constant potential. A first communication unit transmits a first signal in a first frequency band. A second communication unit performs at least one of transmission of a second signal in a second frequency band higher than the first frequency band and at least partially overlapping a harmonic of the first signal, or reception of a third signal in the second frequency band. First and second ends of a conductive wire are connected to the conductor unit. The second communication unit includes at least one of a transmitting filter that passes the second signal, a receiving filter that passes the third signal, or a low-noise amplifier that amplifies the third signal. The conductive wire is located between a first power amplifier of the first communication unit, and at least one of the transmitting filter, receiving filter, or low-noise amplifier of the second communication unit.

19 Claims, 8 Drawing Sheets

(56) References Cited

U.S. PATENT DOCUMENTS

| | | |
|---|---|---|
| 2013/0043961 A1 | 2/2013 | Gebauer et al. |
| 2014/0167232 A1 | 6/2014 | LoBianco et al. |
| 2017/0093442 A1* | 3/2017 | Jayaraman ............ H04W 52/52 |
| 2017/0118841 A1 | 4/2017 | Ino |
| 2017/0264337 A1 | 9/2017 | Kogure et al. |

FOREIGN PATENT DOCUMENTS

| | | |
|---|---|---|
| JP | 2017-084898 A | 5/2017 |
| WO | 2014/052796 A1 | 4/2014 |
| WO | WO-2014052796 A1 * | 4/2014 ............ H01L 24/48 |
| WO | 2016/104011 A1 | 6/2016 |

OTHER PUBLICATIONS

Written Opinion for International Application No. PCT/JP2018/030701, dated Sep. 18, 2018.

* cited by examiner

RADIO-FREQUENCY MODULE

This is a continuation of International Application No. PCT/JP2018/030701 filed on Aug. 20, 2018 which claims priority from Japanese Patent Application No. 2017-171733 filed on Sep. 7, 2017. The contents of these applications are incorporated herein by reference in their entireties.

BACKGROUND OF THE DISCLOSURE

1. Field of the Disclosure

The present disclosure relates to a radio-frequency module, more specifically, a radio-frequency module used for communication in plural frequency bands.

2. Description of the Related Art

A radio-frequency module described below has been proposed in related art (Japanese Unexamined Patent Application Publication No. 2017-084898). The radio-frequency module is disposed in the front-end section of cellular phones or other devices that support multimode/multiband operation or carrier aggregation (CA). The radio-frequency module amplifies a transmit signal inputted from a radio-frequency integrated circuit (RFIC) or other devices, and outputs the amplified signal to an antenna or other devices.

The radio-frequency module described in Japanese Unexamined Patent Application Publication No. 2017-084898 includes a multilayer substrate, a power amplifier, a bias circuit, and a matching circuit. The power amplifier amplifies a radio-frequency signal in a predetermined band (e.g., 700 to 800 MHz) inputted to an input terminal from the RFIC, and outputs the amplified signal to an external antenna through an output terminal via the matching circuit. The bias circuit includes an inductor and a capacitor, and supplies a bias voltage to the power amplifier. The matching circuit is disposed between the output terminal of the power amplifier, and a circuit (output terminal) located after the power amplifier. The matching circuit is used to match the output impedance of the power amplifier with the impedance of the circuit located after the power amplifier.

For radio-frequency modules including plural communication units to support multimode/multiband operation, carrier aggregation, or other operating modes, a situation may often arise in which, for example, a harmonic wave generated from the power amplifier of a communication unit designed for low-band operation passes (leaks) into a communication unit designed for mid-band operation that performs at least one of transmission and reception on a frequency band at least partially overlapping the harmonic wave, thus degrading communication performance. Accordingly, a further improvement in communication performance is desired.

BRIEF SUMMARY OF THE DISCLOSURE

Accordingly, it is an object of the present disclosure to provide a radio-frequency module capable of providing improved communication performance.

A radio-frequency module according to an aspect of the present disclosure includes a substrate, a first communication unit, a second communication unit, and at least one conductive wire. The substrate includes a conductor unit to which a constant potential is applied. The first communication unit is disposed on the substrate. The first communication unit transmits a first signal in a first frequency band. The second communication unit is disposed on the substrate. The second communication unit performs at least one of transmission of a second signal in a second frequency band or reception of a third signal in the second frequency band. The second frequency band is higher than the first frequency band and at least partially overlaps a harmonic wave of the first signal. The at least one conductive wire has a first end and a second end. The first and second ends of the at least one conductive wire are connected to the conductor unit. The first communication unit includes a first power amplifier. The first power amplifier amplifies a radio-frequency signal in the first frequency band and outputs the amplified radio-frequency signal as the first signal. The second communication unit includes at least one of a transmitting filter, a receiving filter, or a low-noise amplifier. The transmitting filter passes the second signal. The receiving filter passes the third signal. The low-noise amplifier amplifies the third signal. The at least one conductive wire is spaced apart from the first communication unit and the second communication unit. The at least one conductive wire is located between the first power amplifier of the first communication unit, and the at least one of the transmitting filter, the receiving filter, or the low-noise amplifier of the second communication unit.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

A radio-frequency module according to an embodiment of the disclosure will be described below with reference to the drawings.

FIGS. 1, 2, 5 to 8, and 11 to which reference will be made in the following description of an embodiment or other features are all schematic illustrations. Accordingly, the relative sizes or thicknesses of individual components in these figures may not necessarily reflect their actual dimensional relationships.

Embodiments (1) General Arrangement of Radio-Frequency Module

A radio-frequency module 1 according to an embodiment of the present disclosure will be described below with reference to the drawings.

Figure 1:
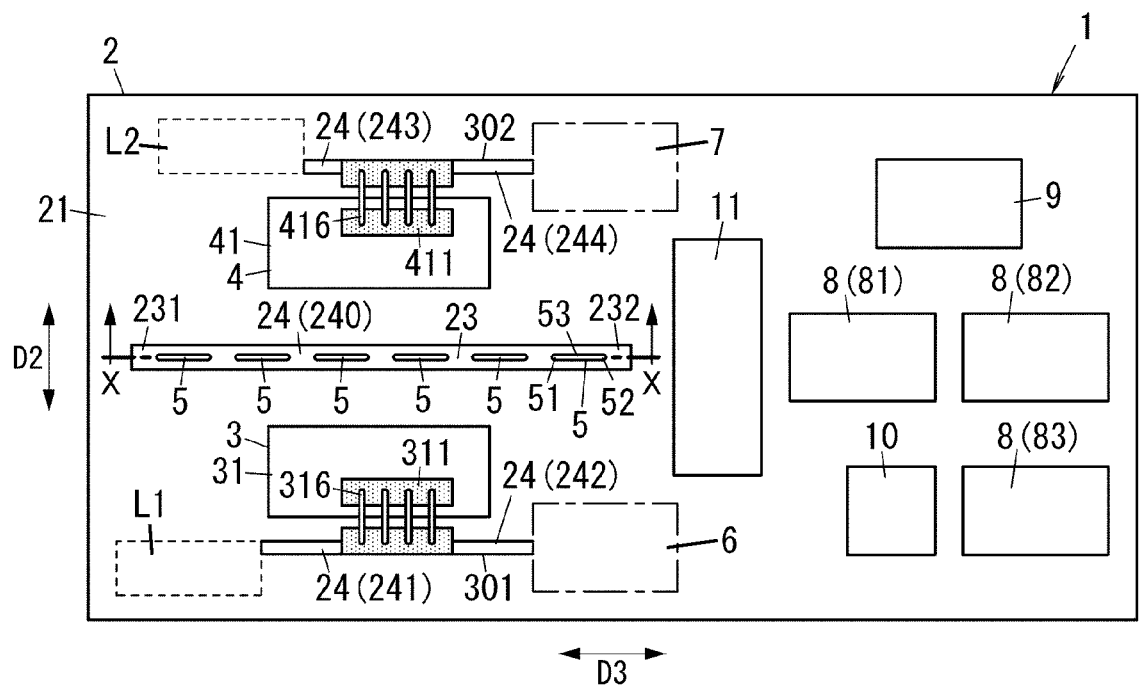
FIG. 1 is a layout diagram of a radio-frequency module according to an embodiment of the present disclosure.

As illustrated in FIG. 1, the radio-frequency module 1 according to the embodiment includes a substrate 2, a first communication unit 3, and a second communication unit 4. The first communication unit 3 and the second communication unit 4 are disposed on the substrate 2. The first communication unit 3 transmits a first signal in a first frequency band. The first signal is, for example, a transmit signal for fourth-generation (4G) communication (fourth-generation mobile communication system). The second communication unit 4 transmits a second signal in a second frequency band higher than the first frequency band. The second signal is, for example, a transmit signal for second-generation (2G) communication (second-generation mobile communication system). The first frequency band and the second frequency band do not overlap.

The substrate 2 includes a conductor unit 23 to which a constant potential (e.g., ground potential) is applied. The term "constant potential" as used herein means a fixed potential, for example, a ground potential. The constant potential is, for example, 0 V. However, the constant potential may not necessarily be 0 V but may be a potential other than 0 V. As viewed in the thickness direction of the substrate 2, the conductor unit 23 of the substrate 2 is positioned between and away from the first communication unit 3 and the second communication unit 4. The radio-frequency module 1 includes plural (six in the depicted example) conductive wires 5 electrically connected to the conductor unit 23. The conductive wires 5 are disposed at a position on the substrate 2 between and away from the first communication unit 3 and the second communication unit 4. The conductive wires 5 each have a first end 51 and a second end 52. The conductive wires 5 are each connected at the first end 51 and the second end 52 to the conductor unit 23.

Figure 3:
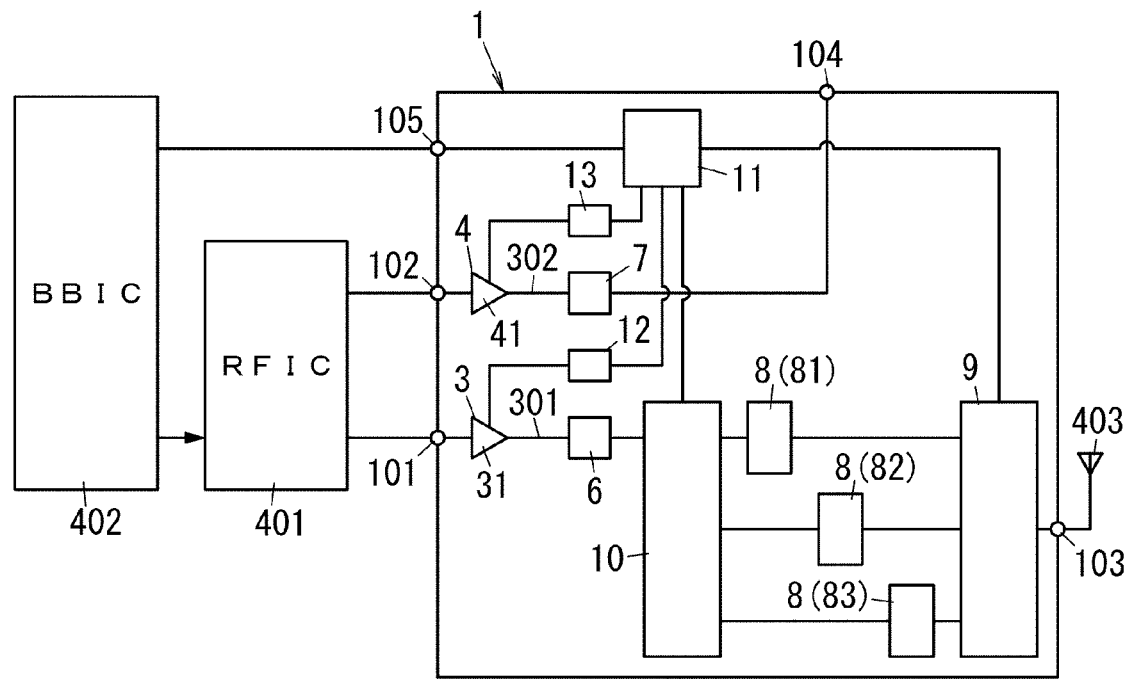
FIG. 3 is a schematic circuit diagram of the radio-frequency module.

As illustrated in FIG. 3, the radio-frequency module 1 further includes a first input terminal 101, a second input terminal 102, an antenna terminal 103, an output terminal 104, and a control terminal 105. Each of the first input terminal 101 and the second input terminal 102 is a terminal connected to, for example, an external RF signal processing circuit 401 to receive a radio-frequency signal (transmit signal) from the RF signal processing circuit 401. The RF signal processing circuit 401 is, for example, a radio-frequency integrated circuit (RFIC), and applies signal processing to a radio-frequency signal. For example, the RF signal processing circuit 401 applies signal processing such as up-conversion to a radio-frequency signal (transmit signal) outputted from a baseband signal processing circuit 402, and outputs the resulting radio-frequency signal to the first input terminal 101. The baseband signal processing circuit 402 is, for example, a baseband integrated circuit (BBIC). The baseband signal processing circuit 402 applies the predetermined signal processing to a transmit signal inputted from an external source. The antenna terminal 103 is a terminal connected to an external antenna 403. The output terminal 104 is a terminal connected to an external device (e.g., an antenna different from the antenna 403) to output, to the external device, a second signal from the second communication unit 4. The control terminal 105 is a terminal connected to, for example, the baseband signal processing circuit 402 to receive a control signal from the baseband signal processing circuit. The RF signal processing circuit 401, the baseband signal processing circuit 402, and the antenna 403 are not components of the radio-frequency module 1.

The first communication unit 3 of the radio-frequency module 1 includes a first power amplifier 31, and a first matching circuit 6. The second communication unit 4 of the radio-frequency module 1 includes a second power amplifier 41, and a second matching circuit 7, which doubles as a transmitting filter. The radio-frequency module 1 further includes plural (e.g., three) filters 8, a first switching circuit 9, a second switching circuit 10, a first bias circuit 12 (see FIG. 4A), a second bias circuit 13 (see FIG. 4B), and a control circuit 11.

The first matching circuit 6 is an impedance matching circuit disposed between the first power amplifier 31 of the first communication unit 3, and the antenna terminal 103. The first matching circuit 6 is located between the first power amplifier 31 and the second switching circuit 10.

The second matching circuit 7 is an impedance matching circuit disposed between the second power amplifier 41 of the second communication unit 4, and the output terminal 104. The second matching circuit 7 doubles as a transmitting filter that passes the second signal.

Each of the filters 8 is disposed between the first communication unit 3 and the antenna terminal 103, at a position between the second switching circuit 10, which is connected to the first communication unit 3, and the first switching circuit 9, which is connected to the antenna terminal 103.

The first switching circuit 9 is a switching circuit used to switch which one of the filters 8 is to be connected to the antenna terminal 103.

The second switching circuit 10 is a switching circuit used to switch which one of the filters 8 is to be connected to the first matching circuit 6.

The first bias circuit 12 (see FIG. 4A) is a circuit used to supply, from the control circuit 11 to the first communication unit 3, a first operating voltage Vcc1 (first bias voltage) for the first power amplifier 31 of the first communication unit 3.

The second bias circuit 13 (see FIG. 4B) is a circuit used to supply, from the control circuit 11 to the second communication unit 4, a second operating voltage Vcc2 (second bias voltage) for the second power amplifier 41 of the second communication unit 4.

As illustrated in FIG. 3, the control circuit 11 is connected to the control terminal 105 to control, based on a control signal inputted from the control terminal 105, the first communication unit 3, the second communication unit 4, the first switching circuit 9, and the second switching circuit 10. For example, the control circuit 11 controls the first communication unit 3 by varying the value of the first operating voltage Vcc1, which is supplied to the first power amplifier 31 of the first communication unit 3 via the first bias circuit 12. Further, for example, the control circuit 11 controls the second communication unit 4 by varying the value of the second operating voltage Vcc2, which is supplied to the second power amplifier 41 of the second communication unit 4 via the second bias circuit 13.

The radio-frequency module 1 further includes a covering layer 14 (see FIG. 2) disposed over a first major side 21 of the substrate 2 to cover plural electronic components, the conductive wires 5, and other components that are mounted on the first major side 21 of the substrate 2. Examples of plural electronic components include the above-mentioned components such as the first communication unit 3, the second communication unit 4, the filters 8, the first switching circuit 9, the second switching circuit 10, the control circuit 11, the first bias circuit 12, and the second bias circuit 13.

In the radio-frequency module 1 described above, the first communication unit 3 is connected to the antenna terminal 103, and the second communication unit 4 is connected to the output terminal 104. With this configuration, when the first communication unit 3 is transmitting the first signal in the first frequency band through a first transmission line 301, the second communication unit 4 is able to transmit the second signal in the second frequency band through a second transmission line 302. FIG. 1 depicts only a portion of the first transmission line 301 and a portion of the second transmission line 302.

(2) Components of Radio-Frequency Module

Components of the radio-frequency module 1 will be described below with reference to the drawings.

(2.1) First Power Amplifier of First Communication Unit and Second Power Amplifier of Second Communication Unit The first communication unit 3 includes the first power amplifier 31 (see FIG. 4A), which is a power amplifier for 4G communication. The 4G standard used is, for example, 3GPP Long Term Evolution (LTE). The frequency band of the first signal transmitted from the first communication unit 3 falls within the LTE low-band (698 MHz to 960 MHz). The second communication unit 4 includes the second power amplifier 41 for 2G communication. The 2G standard used is, for example, Global System for Mobile Communications (GSM®). The frequency band of the second signal transmitted from the second communication unit 4 falls within GSM® Band 3 (1710 MHz to 1785 MHz), which is the 1800-MHz band.

As illustrated in FIG. 3, the first power amplifier 31 has an input end electrically connected to the first input terminal 101. The first power amplifier 31 has an output end 311 (see FIG. 1) electrically connected to the antenna terminal 103. More specifically, the output end 311 of the first power amplifier 31 is connected to the antenna terminal 103 via, for example, the following components: the first matching circuit 6, the second switching circuit 10, one of the three filters 8, and the first switching circuit 9. For example, the first power amplifier 31 amplifies a radio-frequency signal (transmit signal) inputted via the first input terminal 101 to its input end from the RF signal processing circuit 401, and outputs the amplified radio-frequency signal from the output end 311 as the first signal. The first power amplifier 31 is a multiband power amplifier capable of amplifying radio-frequency signals in plural (e.g., three) different communication bands falling within the first frequency band. In the following description, the three communication bands will be referred to as a first communication band, a second communication band, and a third communication band if these communication bands are to be distinguished from each other. The first communication band is, for example, LTE Band 8 (880 MHz to 915 MHz). The second communication band is, for example, LTE Band 20 (832 MHz to 862 MHz). The third communication band is, for example, LTE Band 5 (824 MHz to 849 MHz). The first power amplifier 31 amplifies a radio-frequency signal in one of the first, second, and third communication bands, and outputs the amplified radio-frequency signal from the output end 311 as the first signal.

Figure 4A:
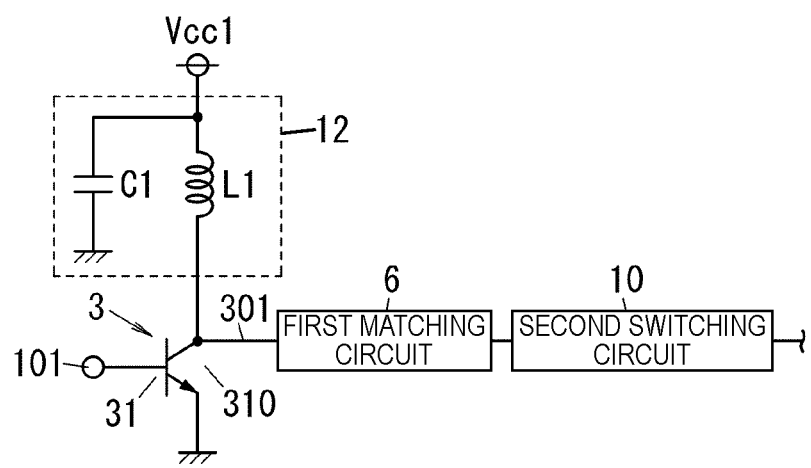
FIG. 4A is a schematic circuit diagram of a portion of the radio-frequency module that includes a first power amplifier and a first matching circuit.

As illustrated in FIG. 4A, the first power amplifier 31 includes an npn transistor 310. The transistor 310 of the first power amplifier 31 has a base connected to the first input terminal 101, a collector that is connected to the first transmission line 301 and is connected to the control circuit 11 via the first bias circuit 12, and an emitter that is grounded. In the first power amplifier 31, the collector of the transistor 310 constitutes the output end 311 (see FIG. 1) of the first power amplifier 31. The transistor 310 amplifies a radio-frequency signal inputted to the base, by an amplification factor according to the first operating voltage Vcc1 supplied from the control circuit 11 via the first bias circuit 12, and outputs the amplified radio-frequency signal to the first transmission line 301 as the first signal.

As illustrated in FIG. 3, the second power amplifier 41 has an input end connected to the second input terminal 102. The second power amplifier 41 has an output end 411 (see FIG. 1) connected to the output terminal 104. More specifically, the output end 411 of the second power amplifier 41 is connected to the output terminal 104 via the second matching circuit 7. For example, the second power amplifier 41 amplifies a radio-frequency signal (transmit signal) inputted via the second input terminal 102 to its input end from the RF signal processing circuit 401, and outputs the amplified radio-frequency signal from the output end 411 as the second signal.

Figure 4B:
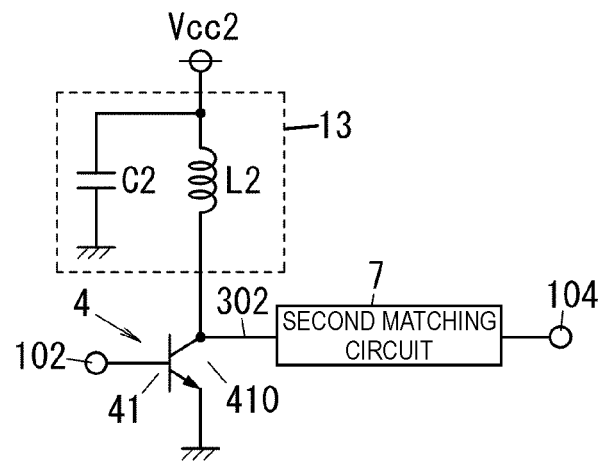
FIG. 4B is a schematic circuit diagram of a portion of the radio-frequency module that includes a second power amplifier and a second matching circuit.

As illustrated in FIG. 4B, the second power amplifier 41 includes an npn transistor 410. The transistor 410 of the second power amplifier 41 has a base connected to the second input terminal 102, a collector that is connected to the second transmission line 302 and is connected to the control circuit 11 via the second bias circuit 13, and an emitter that is grounded. In the second power amplifier 41, the collector of the transistor 410 constitutes the output end 411 (see FIG. 1) of the second power amplifier 41. The transistor 410 amplifies a radio-frequency signal inputted to the base, by an amplification factor according to the second operating voltage Vcc2 supplied from the control circuit 11 via the second bias circuit 13, and outputs the amplified radio-frequency signal to the second transmission line 302 as the second signal.

(2.2) First Matching Circuit of First Communication Unit and Second Matching Circuit of Second Communication Unit The first matching circuit 6 is an impedance matching circuit used to match the output impedance of the first power amplifier 31, which is disposed before the first matching circuit 6, with the input impedance of the circuit disposed after the first matching circuit 6. More specifically, the first matching circuit 6 is disposed between the first power amplifier 31 and the second switching circuit 10, and adjusts the impedance in the first frequency band on the side of the antenna terminal 103 as seen from the first power amplifier 31 to, for example, about 50Ω. The first matching circuit 6 includes, for example, an inductor and a capacitor as its components. The inductor of the first matching circuit 6 is, for example, a chip inductor. The capacitor of the first matching circuit 6 is, for example, a chip capacitor.

The second matching circuit 7 is a circuit used to match the output impedance of the second power amplifier 41, which is disposed before the second matching circuit 7, with the input impedance of the circuit disposed after the second matching circuit 7. More specifically, the second matching circuit 7 is disposed between the second power amplifier 41 and the output terminal 104, and adjusts the impedance in the second frequency band on the side of the output terminal 104 as seen from the second power amplifier 41 to, for example, about 50Ω. The second matching circuit includes, for example, an inductor and a capacitor. The inductor of the second matching circuit 7 is, for example, a chip inductor. The capacitor of the second matching circuit 7 is, for example, a chip capacitor. The second matching circuit 7 doubles as a transmitting filter that passes the second signal outputted from the second power amplifier 41.

(2.3) Filter

Each of the plural (e.g., three) filters 8 is, for example, a surface acoustic wave (SAW) filter. In the following description, the three filters 8 will be referred to as a first filter 81, a second filter 82, and a third filter 83 if the three filters 8 are to be distinguished from each other. The first filter 81 is a filter with a pass band including at least the first band of frequencies mentioned above, and an attenuation band including other frequencies. The second filter 82 is a filter with a pass band including at least the second band of frequencies mentioned above, and an attenuation band including other frequencies. The third filter 83 is a filter with a pass band including at least the third band of frequencies mentioned above, and an attenuation band including other frequencies. In short, each of the filters 8 has a different pass band. Each of the filters 8 has an input terminal and an output terminal. The input terminal of the filter 8 is connected to the second switching circuit 10. The output terminal of the filter 8 is connected to the first switching circuit 9.

The control circuit 11 of the radio-frequency module 1 controls the first switching circuit 9 to connect the output terminal of one of the filters 8 to the antenna terminal 103. Further, the control circuit 11 of the radio-frequency module 1 controls the second switching circuit 10 to connect the input terminal of one of the filters 8 to the first matching circuit 6.

(2.4) First Switching Circuit and Second Switching Circuit

The first switching circuit 9 includes plural selective terminals, which are terminals to be selected and connected in a one-to-one relation to the filters 8 (the output terminals of the filters 8), and a common terminal connected to the antenna terminal 103. The second switching circuit 10 includes a common terminal connected to the first matching circuit 6, and plural selective terminals connected in a one-to-one relation to the filters 8 (the input terminals of the filters 8).

Each of the first switching circuit 9 and the second switching circuit 10 is, for example, a switching integrated circuit (IC). The switching IC includes plural (e.g., three) semiconductor switches. More specifically, the switching IC includes three semiconductor switches each connected between the common terminal and the corresponding one of the three selective terminals. Each semiconductor switch is, for example, a field effect transistor (FET). The semiconductor switches are controlled by the control circuit 11.

The three semiconductor switches of the first switching circuit 9 are controlled by the control circuit 11 to connect one of the three filters 8 with the antenna terminal 103. The three semiconductor switches of the second switching circuit 10 are controlled by the control circuit 11 to connect one of the three filters 8 with the first matching circuit 6. The first switching circuit 9 is a low-band antenna switch. The second switching circuit 10 is a low-band band-selector switch.

(2.5) First Bias Circuit and Second Bias Circuit

The first bias circuit 12 (see FIG. 4A) is a circuit used to supply the first operating voltage Vcc1 from the control circuit 11 (see FIGS. 1 and 3) to the first power amplifier 31. The first bias circuit 12 includes a first choke coil L1, and a first capacitor C1. The first choke coil L1 is, for example, a thin-film inductor disposed inside the substrate 2. One end of the first choke coil L1 is electrically connected to the control circuit 11. The other end of the first choke coil L1 is electrically connected to the output end 311 of the first power amplifier (see FIG. 1). More specifically, the other end of the first choke coil L1 is connected to the output end 311 of the first power amplifier 31 via, for example, a via-conductor of the substrate 2, a first conductive layer 24 (241) of the substrate 2, and a bonding wire 316. The one end of the first choke coil L1 is grounded via the first capacitor C1.

The second bias circuit 13 (see FIG. 4B) is a circuit used to supply the second operating voltage Vcc2 from the control circuit 11 to the second power amplifier 41. The second bias circuit 13 includes a second choke coil L2, and a second capacitor C2. The second choke coil L2 is, for example, a thin-film inductor disposed inside the substrate 2. One end of the second choke coil L2 is electrically connected to the control circuit 11. The other end of the second choke coil L2 is electrically connected to the output end 411 (see FIG. 1) of the second power amplifier 41. More specifically, the other end of the second choke coil L2 is connected to the output end 411 of the second power amplifier 41 via, for example, a via-conductor of the substrate 2, the first conductive layer 24 (243) of the substrate 2, and a bonding wire 416. The one end of the second choke coil L2 is grounded via the second capacitor C2.

(2.6) Control Circuit

As illustrated in FIG. 3, the control circuit 11 receives a control signal from an external device (e.g., the baseband signal processing circuit 402) via the control terminal 105, and based on the control signal, the control circuit 11 controls each of the first communication unit 3, the second communication unit 4, the first switching circuit 9, and the second switching circuit 10. For example, the control circuit 11 controls the first power amplifier 31 such that the first power amplifier 31 amplifies a radio-frequency signal (a radio-frequency signal in one of plural communication bands falling within the first frequency band) inputted to the first power amplifier 31 via the first input terminal 101. The control circuit 11 also controls the first switching circuit 9 and the second switching circuit 10 to respectively connect the antenna terminal 103 and the first power amplifier 31 to a specific one of the filters 8. The control circuit 11 is, for example, a switching integrated circuit (IC).

(2.7) Substrate

The substrate 2 is a substrate on which to mount components such as the first communication unit 3, the second communication unit 4, the filters 8, the first switching circuit 9, the second switching circuit 10, the control circuit 11, the first bias circuit 12, and the second bias circuit 13.

Figure 2:
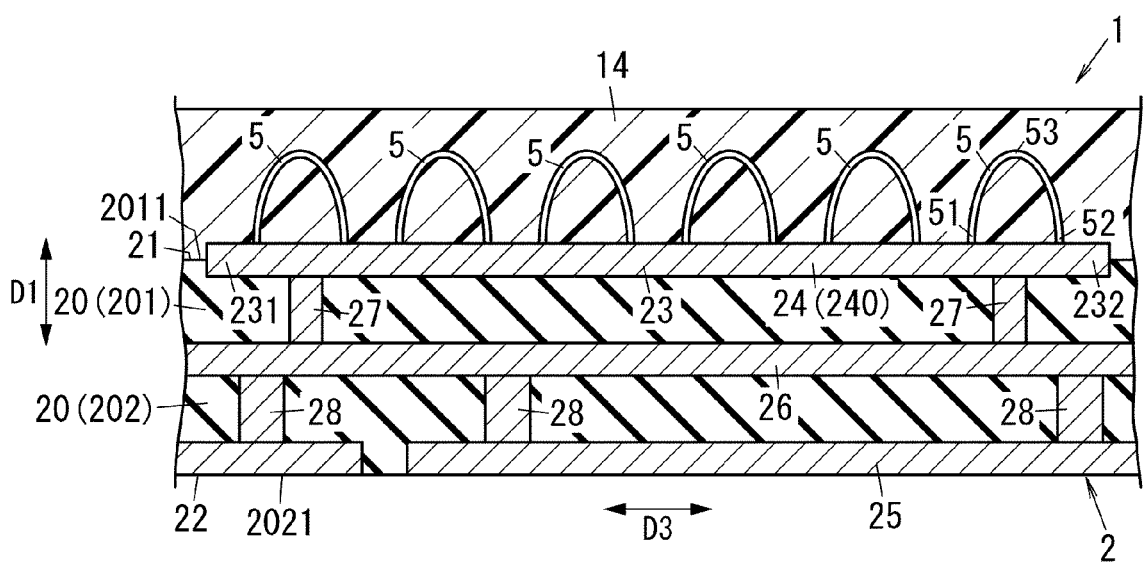
FIG. 2 is a cross-sectional view of the radio-frequency module taken along a line X-X in FIG. 1.

The substrate 2 is, for example, a multilayer substrate. The multilayer substrate is, for example, a printed circuit board. As illustrated in FIG. 2, the substrate 2 has the first major side 21 and a second major side 22 that are located on opposite sides of the substrate 2 in a predetermined direction (to be also referred to as the first direction D1 hereinafter) of the radio-frequency module 1. More specifically, the substrate 2 is formed in a substantially plate-like shape, and has the first major side 21 and the second major side 22 that are opposite sides of the substrate 2 in the thickness direction of the substrate 2. The first major side 21 and the second major side 22 face away from each other. As illustrated in FIG. 1, the shape of the substrate 2 in a plan view (shape of the outer periphery of the substrate 2 as viewed in the direction of its thickness) is, for example, substantially rectangular. The substrate 2 has planar dimensions of, for example, about 6 mm×about 8 mm. In this case, the short side of the substrate 2 extending in a second direction D2 orthogonal to the first direction D1 has a length of about 6 mm, and the long side of the substrate 2 extending in a third direction D3 orthogonal to the first and second directions D1 and D2 has a length of about 8 mm.

As illustrated in FIG. 2, the substrate 2 has plural (two in FIG. 2) electrical insulating layers 20. The electrical insulating layers 20 are stacked in the first direction D1. The electrical insulating layers 20 are made of, for example, resin. Of the two electrical insulating layers 20, the electrical insulating layer 20 located near the first major side 21 of the substrate 2 will be hereinafter sometimes referred to as the first electrical insulating layer 201, and the electrical insulating layer 20 located near the second major side 22 will be hereinafter sometimes referred to as the second electrical insulating layer 202.

Plural first conductive layers 24 are provided in or on a surface 2011 of the first electrical insulating layer 201 opposite to the side of the first electrical insulating layer 201 near the second electrical insulating layer 202. The side of each first conductive layer 24 that is exposed without contacting the first electrical insulating layer 201, and a part of the surface 2011 of the first electrical insulating layer 201 that is exposed without being covered by the first conductive layers 24 constitute the first major side 21 of the substrate 2. Each first conductive layer 24 is made of, for example, Cu. That is, each first conductive layer 24 is a Cu layer. Of the first conductive layers 24, only the following first conductive layers 24 are depicted in FIG. 1: the first conductive layer 24 (240) constituting the conductor unit 23 to which the above-mentioned constant potential (e.g., ground potential) is applied; the first conductive layer 24 (241) constituting a first interconnection layer that connects the first choke coil L1 of the first bias circuit 12 with the output end of the first communication unit 3; the first conductive layer 24 (242) that connects the output end of the first power amplifier 31 with the first matching circuit 6 in the first communication unit 3 and constitutes a portion of the first transmission line 301; the first conductive layer 24 (243) constituting a second interconnection layer that connects the second choke coil L2 of the second bias circuit 13 with the second matching circuit 7; and the first conductive layer 24 (244) that connects the output end of the second power amplifier 41 with the second matching circuit 7 in the second communication unit 4 and constitutes a portion of the second transmission line 302.

A second conductive layer 25 is disposed on a surface 2021 of the second electrical insulating layer 202 opposite to the side of the second electrical insulating layer 202 near the first electrical insulating layer 201. The second conductive layer 25 is made of, for example, Cu. That is, the second conductive layer 25 is a Cu layer. An exposed part of the second electrical insulating layer 202 constitutes a portion of the second major side 22 of the substrate 2.

The substrate 2 includes a third conductive layer 26 disposed between the first electrical insulating layer 201 and the second electrical insulating layer 202. The third conductive layer 26 is made of Cu. That is, the third conductive layer 26 is a Cu layer. The substrate 2 includes plural (e.g., two) first via-conductors 27 and plural (three in the depicted example) second via-conductors 28. The first via-conductors 27 penetrate the first electrical insulating layer 201, and are located between the conductor unit 23 and the third conductive layer 26. The second via-conductors 28 penetrate the second electrical insulating layer 202, and are located between the third conductive layer 26 and the second conductive layer 25. The conductor unit 23 of the substrate 2 is thus electrically connected to the second conductive layer 25. When, for example, the radio-frequency module 1 is mounted on a circuit board for use, the conductor unit 23 is electrically connected to the ground of the circuit board, and thus the potential of the conductor unit 23 serves as a ground potential. In other words, in the radio-frequency module 1, the second conductive layer 25 is used as a ground electrode, and thus the potential of the conductor unit 23 serves as a ground potential.

As illustrated in FIG. 1, as viewed in the thickness direction of the substrate 2, the conductor unit 23 has a substantially linear shape, and is disposed substantially in the middle of the substrate 2 with respect to the second direction D2 orthogonal to the first direction D1 (see FIG. 2) so as to extend in the third direction D3 orthogonal to the first and second directions D1 and D2. The conductor unit 23 has a length in the third direction D3 that is, for example, substantially one-half of the length of the substrate 2 in the third direction D3. The conductor unit 23 has a width in the second direction D2 that is less than the spacing between the first communication unit 3 and the second communication unit 4, and greater than the line diameter of each conductive wire 5 (greater than the portion of the joint of the conductive wire 5 with the conductor unit 23).

(2.8) Conductive Wires

Each of the conductive wires 5 is, for example, a metal wire for use in wire bonding technology. Accordingly, the conductive wire 5 can be made of the same metal wire as the bonding wires 316 and 416, and can be connected to the conductor unit 23 by using a wire bonding device. Examples of the conductive wires 5 that can be used include Au wires, Al wires, Cu wires, and Pd-coated Cu wires. As illustrated in FIGS. 1 and 2, with respect to the second direction D2 of the radio-frequency module 1 orthogonal to the first direction D1, plural (six in the depicted example) conductive wires 5 are disposed on the conductor unit 23 of the substrate 2 at a position between the first communication unit 3 and the second communication unit 4. Thus, in the radio-frequency module 1, each conductive wire 5 is located between the first power amplifier 31 (power amplifier) of the first communication unit 3, and the second matching circuit 7 (transmitting filter) of the second communication unit 4. The conductive wires 5 are spaced apart from the first communication unit 3 and the second communication unit 4 in the second direction D2. Each conductive wire 5 is directly connected to the conductor unit 23 of the substrate 2 at its both ends (first and second ends 51 and 52). Each conductive wire 5 is thus electrically connected to the conductor unit 23. The conductive wires 5 are disposed at substantially equal intervals in the third direction D3. The term "substantially equal intervals" as used herein may not strictly mean the same interval, but it may suffice that these intervals be within a predetermined range of values. The conductive wires 5 as a whole are disposed over the area from a first end 231 to a second end 232 of the conductor unit 23 in the third direction D3.

Each conductive wire 5 is formed in a substantial arch-like shape, and has the first and second ends 51 and 52, and an apex portion 53. The first and second ends 51 and 52 are spaced apart from each other in the third direction D3. The apex portion 53 constitutes a portion of the conductive wire 5 between the first end 51 and the second end 52, and is spaced apart from the first major side 21 of the substrate 2 in the first direction D1. In the radio-frequency module 1, the distance in the first direction D1 between the first major side 21 of the substrate 2 and the apex portion 53 of the conductive wire 5 is greater than the distance in the first direction D1 between the first major side 21 of the substrate 2 and the surface of the first power amplifier 31 (the surface opposite from the side of the first power amplifier 31 near the substrate 2) that constitutes the first communication unit 3.

(2.9) Covering Layer

As illustrated in FIG. 2, the covering layer 14 is provided over the first major side 21 of the substrate 2. The covering layer 14 is not illustrated in FIG. 1. The covering layer 14 has electrical insulating properties. The covering layer 14 seals plural electronic components and plural conductive wires 5. Examples of plural electronic components include the first communication unit 3, the second communication unit 4, the filters 8, the first switching circuit 9, the second switching circuit 10, the control circuit 11, the first bias circuit 12, and the second bias circuit 13. The covering layer 14 is made of, for example, electrical insulating resin (e.g., epoxy resin).

(3) Layout

In the radio-frequency module 1, the following components are disposed on the first major side 21 of the substrate 2 in the layout illustrated in FIG. 1: the first power amplifier 31; the second power amplifier 41; each component constituting the first matching circuit 6; each component constituting the second matching circuit 7; the filters 8; the first switching circuit 9; the second switching circuit 10; and the control circuit 11. For the first bias circuit 12 (see FIG. 4A), only the first choke coil L1 incorporated within the substrate 2 is depicted in FIG. 1, as indicated by the dashed line. For the second bias circuit 13 (see FIG. 4B), only the second choke coil L2 incorporated within the substrate 2 is depicted in FIG. 1, as indicated by the dashed line.

In the radio-frequency module 1, the first communication unit 3 and the second communication unit 4 are spaced apart from each other in the second direction D2. In the radio-frequency module 1, the first choke coil L1 and the second choke coil L2 are spaced apart from each other in the second direction D2. In the radio-frequency module 1, the first conductive layer 24 (242) constituting a portion of the first transmission line 301, and the first conductive layer 24 (244) constituting a portion of the second transmission line 302 are spaced part from each other. In the radio-frequency module 1, the first matching circuit 6 and the second matching circuit 7 are spaced apart from each other in the second direction D2.

In the radio-frequency module 1, the first choke coil L1, the first conductive layer 24 (241), and the first conductive layer 24 (242) are arranged in this order in the third direction D3. The first matching circuit 6 is spaced apart from the first communication unit 3 in the third direction D3.

In the radio-frequency module 1, the second choke coil L2, the first conductive layer 24 (243), and the first conductive layer 24 (244) are arranged in this order in the third direction D3. The second matching circuit 7 is spaced apart from the second communication unit 4 in the third direction D3.

In the radio-frequency module 1, the conductor unit 23 is disposed between the first communication unit 3 (the first power amplifier 31 of the first communication unit 3) and the second communication unit 4 (the transmitting filter of the second communication unit 4), over a greater area than the first power amplifier 31. In this regard, the conductor unit 23 is located between a first group and a second group. The first group includes the first choke coil L1, the first communication unit 3, the first conductive layer 24 (242), and the first matching circuit 6. The second group includes the second choke coil L2, the second communication unit 4, the first conductive layer 24 (244), and the second matching circuit 7.

The filters 8, the first switching circuit 9, the second switching circuit 10, and the control circuit 11 are spaced apart from the conductor unit 23 in the third direction D3.

In the radio-frequency module 1, the conductive wires 5 are arranged in the third direction D3. The first and second ends 51 and 52 of the conductive wires 5 are arranged in the third direction D3.

(4) Effects

The radio-frequency module 1 according to the embodiment includes the substrate 2, the first communication unit 3, the second communication unit 4, and at least one conductive wire 5. The substrate 2 includes the conductor unit 23 to which a constant potential is applied. The term "constant potential" as used herein means a fixed potential, for example, a ground potential. The constant potential is, for example, 0 V. However, the constant potential may not necessarily be 0 V but may be a potential other than 0 V. The first communication unit 3 is disposed on the substrate 2. The first communication unit 3 transmits the first signal in the first frequency band. The second communication unit 4 is disposed on the substrate 2. The second communication unit 4 transmits the second signal in the second frequency band higher than the first frequency band and at least partially overlapping a harmonic wave of the first signal. The conductive wire 5 has the first end 51 and the second end 52. The first and second ends 51 and 52 of the conductive wire 5 are connected to the conductor unit 23. The first communication unit 3 includes the power amplifier (first power amplifier 31) that amplifies a radio-frequency signal in the first frequency band, and outputs the amplified radio-frequency signal as the first signal. The second communication unit 4 includes the transmitting filter (second matching circuit 7) that passes the second signal. The conductive wire 5 is spaced apart from the first communication unit 3 and the second communication unit 4. The conductive wire 5 is located between the power amplifier of the first communication unit 3, and the transmitting filter of the second communication unit 4. The above configuration of the radio-frequency module 1 according to the embodiment helps ensure that a harmonic wave of the first signal radiated from the first communication unit 3 toward the second communication unit 4 at the time when the first communication unit 3 transmits the first signal can be attenuated by the conductive wire 5. Therefore, the above configuration of the radio-frequency module 1 according to the embodiment helps ensure that, for example, in transmitting the first signal from the first communication unit 3, a harmonic wave of the first signal does not pass through the second matching circuit 7 (transmitting filter) of the second communication unit 4 to exit as the unwanted emission from an external device (antenna different from the antenna 403) connected to the output terminal 104. This leads to improved communication performance. To further elaborate in this regard, the above configuration of the radio-frequency module 1 according to the embodiment helps prevent a harmonic wave of the first signal radiated by the first communication unit 3 from passing (leaking) into the second transmission line 302 (a portion of the second transmission line 302 between the second communication unit 4 and the second matching circuit 7) connected to the second communication unit 4, thus allowing for improved communication performance. With the radio-frequency module 1 according to the embodiment, as for the conductive wire 5 that attenuates a harmonic wave of the first signal, only the first and second ends 51 and 52 of the conductive wire 5 need to be connected to the conductor unit 23. This leads to an increased degree of freedom in the shape of the conductive wire 5.

In the radio-frequency module 1 according to the embodiment, in a plan view, the conductor unit 23 is disposed between the first power amplifier 31 of the first communication unit 3 and the second matching circuit 7 (transmitting filter) of the second communication unit 4, over a greater area than the first power amplifier 31. In this regard, the conductor unit 23 is disposed over a greater area than the first power amplifier 31 in a direction transverse to the direction in which the first power amplifier 31 of the first communication unit 3 and the second matching circuit 7 (transmitting filter) of the second communication unit 4 are arranged. With the above configuration of the radio-frequency module 1 according to the embodiment, a harmonic wave of the first signal generated in transmitting the first signal from the first communication unit 3 is less likely to reach the input side of the second matching circuit 7 (transmitting filter) of the second communication unit 4. As a result, the harmonic wave of the first signal is less likely to pass through the transmitting filter. This leads to further improved communication performance.

The radio-frequency module 1 according to the embodiment includes plural conductive wires 5. This configuration of the radio-frequency module 1 according to the embodiment helps further attenuate a harmonic wave of the first signal radiated from the first communication unit 3 toward the second communication unit 4. The above configuration of the radio-frequency module 1 according to the embodiment also has another advantage in that, as compared with a configuration with only one conductive wire 5, the distance in the thickness direction of the substrate 2 between the substrate 2 and the apex portion 53 of each conductive wire 5 can be reduced, thus making it possible to reduce the profile of the radio-frequency module 1 in the thickness direction of the substrate 2.

In the radio-frequency module 1 according to the embodiment, the conductive wires 5 are disposed in a direction (third direction D3) transverse to the direction (second direction D2) in which the first communication unit 3 and the second communication unit 4 are arranged. In this regard, the conductive wires 5 are disposed in a direction transverse to the direction in which the first power amplifier 31 of the first communication unit 3 and the transmitting filter of the second communication unit 4 (second matching circuit 7) are arranged. This configuration of the radio-frequency module 1 according to the embodiment helps further ensure that a harmonic wave of the first signal radiated by the first communication unit 3 toward the second communication unit 4 does not pass (leak) toward the second communication unit 4 (e.g., the second transmission line 302 connected to the second communication unit 4, more specifically, a portion of the second transmission line 302 connecting the second communication unit 4 with the second matching circuit 7 doubling as the transmitting filter).

In the radio-frequency module 1 according to the embodiment, the first communication unit 3 includes the first power amplifier 31 that amplifies an incoming radio-frequency signal in the first frequency band, and outputs the amplified radio-frequency signal as the first signal. Further, the radio-frequency module 1 according to the embodiment includes the first bias circuit 12 that supplies the first power amplifier 31 with the first operating voltage Vcc1 for the first power amplifier 31. The first bias circuit 12 includes the choke coil L1 connected to the output end 311 of the first power amplifier 31. Each conductive wire 5 is disposed between the first group and the second group. The first group includes the first choke coil L1, the first power amplifier 31 and the first matching circuit 6 of the first communication unit 3. The second group includes the second power amplifier 41 and the second matching circuit 7 (transmitting filter) of the second communication unit 4. Each conductive wire 5 may be disposed between the first group and the second group such that the conductive wire 5 is adjacent to the first choke coil L1. The configuration of the radio-frequency module 1 according to the embodiment helps more effectively ensure that the unwanted emission radiated from the vicinity of the output end 311 of the first power amplifier 31 does not pass (leak) toward the transmitting filter (second matching circuit 7) of the second communication unit 4. For the first group, the first power amplifier 31 and the first choke coil L1 may be located in different planes in the thickness direction of the substrate 2, as in the case where the first power amplifier 31 is mounted on the first major side 21 of the substrate 2 and the first choke coil L1 is incorporated within the substrate 2.

In the radio-frequency module 1 according to the embodiment, the second frequency band includes a frequency that is an integer multiple of the frequency of the first signal. This configuration of the radio-frequency module 1 helps more effectively ensure that the unwanted emission (emission including a frequency that is an integer multiple of the frequency of the first signal) generated when the first communication unit 3 transmits the first signal does not affect the transmission of the second signal by the second communication unit 4.

In the radio-frequency module 1 according to the embodiment, the first communication unit 3 includes the first power amplifier 31 that amplifies an incoming radio-frequency signal (first radio-frequency signal) in the first frequency band, and outputs the amplified radio-frequency signal (first radio-frequency signal) as the first signal. The second communication unit 4 includes the second power amplifier 41 that amplifies an incoming radio-frequency signal (second radio-frequency signal) in the second frequency band, and outputs the amplified radio-frequency signal (second radio-frequency signal) as the second signal. This configuration of the radio-frequency module 1 makes it possible to increase the strengths of the first and second signals.

(5) Modifications

(5.1) Modification 1

Figure 5:
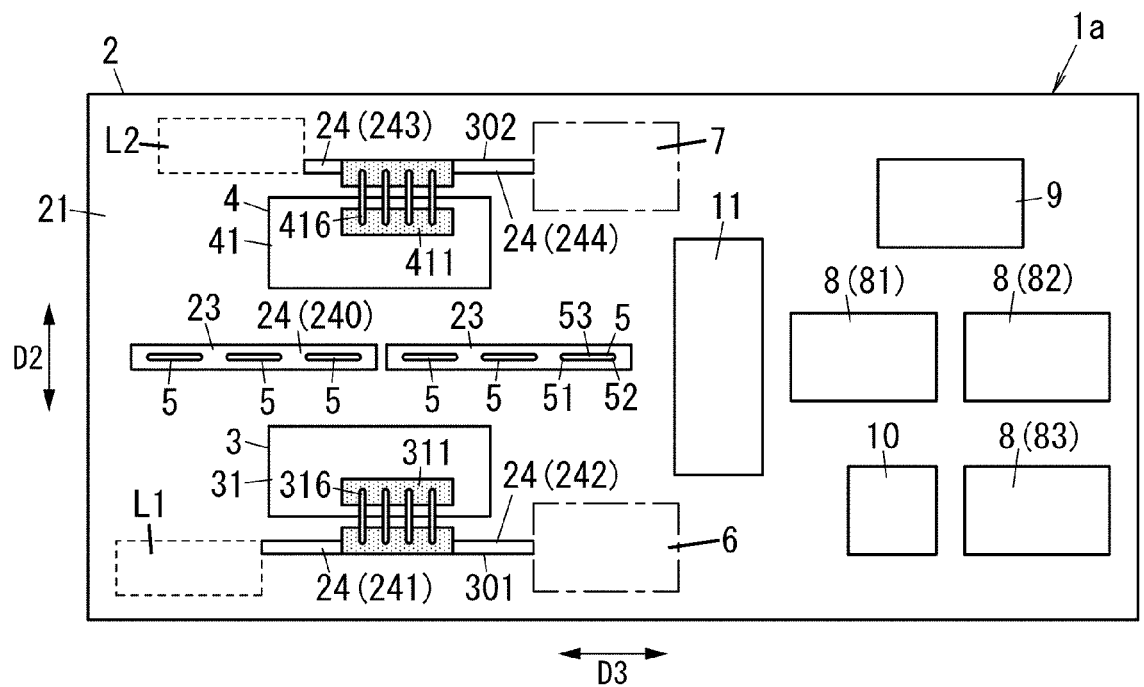
FIG. 5 is a layout diagram of a radio-frequency module according to Modification 1 of the embodiment of the present disclosure.

A radio-frequency module 1a according to Modification 1 of the embodiment differs from the radio-frequency module 1 according to the embodiment in that, as illustrated in FIG. 5, the substrate 2 is provided with plural (e.g., two) conductor units 23. For the radio-frequency module 1a according to Modification 1, components similar to those of the radio-frequency module 1 according to the embodiment will be designated by the same reference signs and will not be described in further detail.

In the radio-frequency module 1a according to Modification 1, the length of each conductor unit 23 in the third direction D3 is substantially one-half of the length of the conductor unit 23 of the radio-frequency module 1 (see FIG. 1) according to the embodiment. The two conductor units 23 are electrically connected to the second conductive layer 25 (see FIG. 2). The two conductor units 23 are thus at the same potential.

In the radio-frequency module 1a according to Modification 1, the two conductor units 23 are arranged in the third direction D3. In the radio-frequency module 1a according to Modification 1, the two conductor units 23 have the same length, and the first and second ends 51 and 52 of three conductive wires 5 are connected to each of the two conductor units 23.

(5.2) Modification 2

Figure 6:
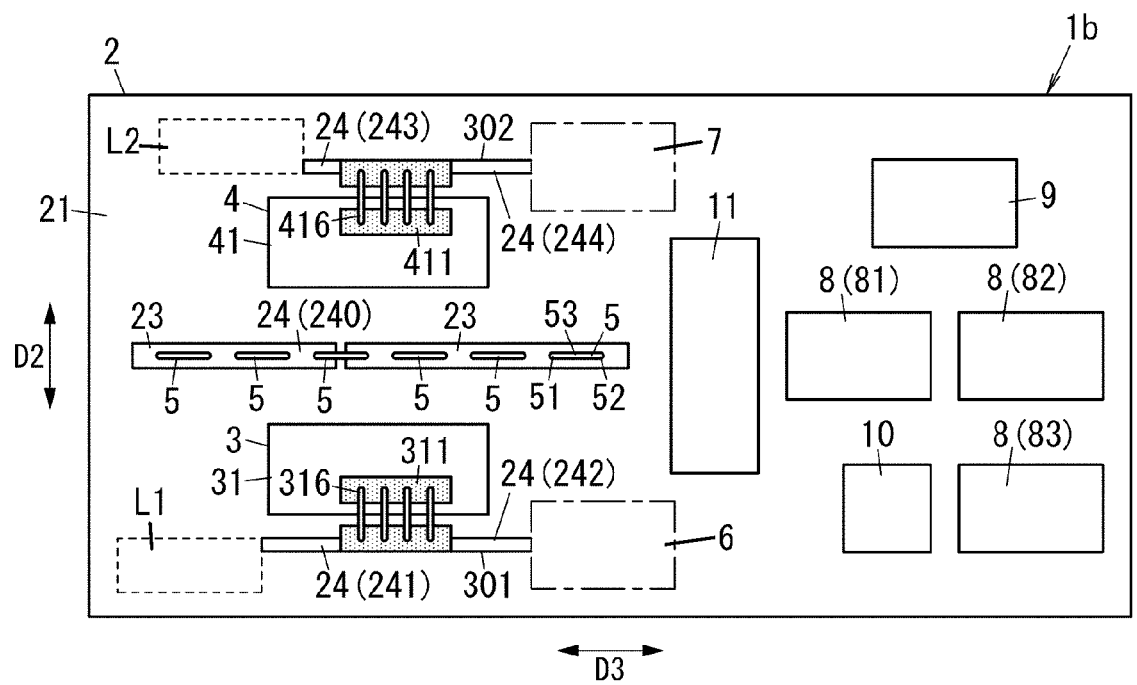
FIG. 6 is a layout diagram of a radio-frequency module according to Modification 2 of the embodiment of the present disclosure.

A radio-frequency module 1b according to Modification 2 of the embodiment differs from the radio-frequency module 1a according to Modification 1 in that the two conductor units 23 differ in length as illustrated in FIG. 6. For the radio-frequency module 1b according to Modification 2, components similar to those of the radio-frequency module 1 according to the embodiment will be designated by the same reference signs and will not be described in further detail.

In the radio-frequency module 1b according to Modification 2, one of the conductive wires 5 arranged in the third direction D3 (third one from the left in FIG. 6) is positioned to extend over the two conductor units 23.

(5.3) Modification 3

Figure 7:
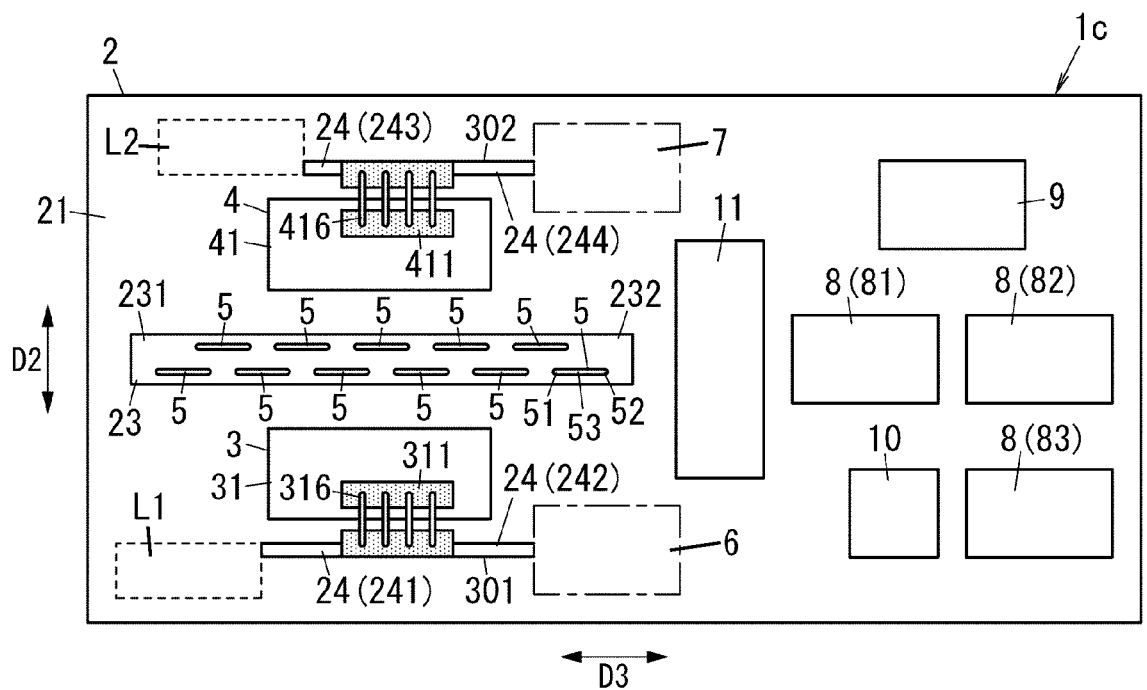
FIG. 7 is a layout diagram of a radio-frequency module according to Modification 3 of the embodiment of the present disclosure.

A radio-frequency module 1c according to Modification 3 of the embodiment differs from the radio-frequency module 1 according to the embodiment in that, as illustrated in FIG. 7, the conductor unit 23 has a width in the second direction D2 greater than the width of the conductor unit 23 of the radio-frequency module 1 (see FIG. 1) according to the embodiment. For the radio-frequency module 1c according to Modification 3, components similar to those of the radio-frequency module 1 according to the embodiment will be designated by the same reference signs and will not be described in further detail.

In the radio-frequency module 1c according to Modification 3, plural (eleven) conductive wires 5 are arranged in two rows, with the second direction D2 defined as the row direction. In the radio-frequency module 1c according to Modification 3, one conductive wire 5 of plural (five) conductive wires 5 in one row (upper row in FIG. 7) is positioned to extend over two adjacent conductive wires 5 of plural (six) conductive wires 5 in the other row (lower row in FIG. 7).

(5.4) Modification 4

Figure 8:
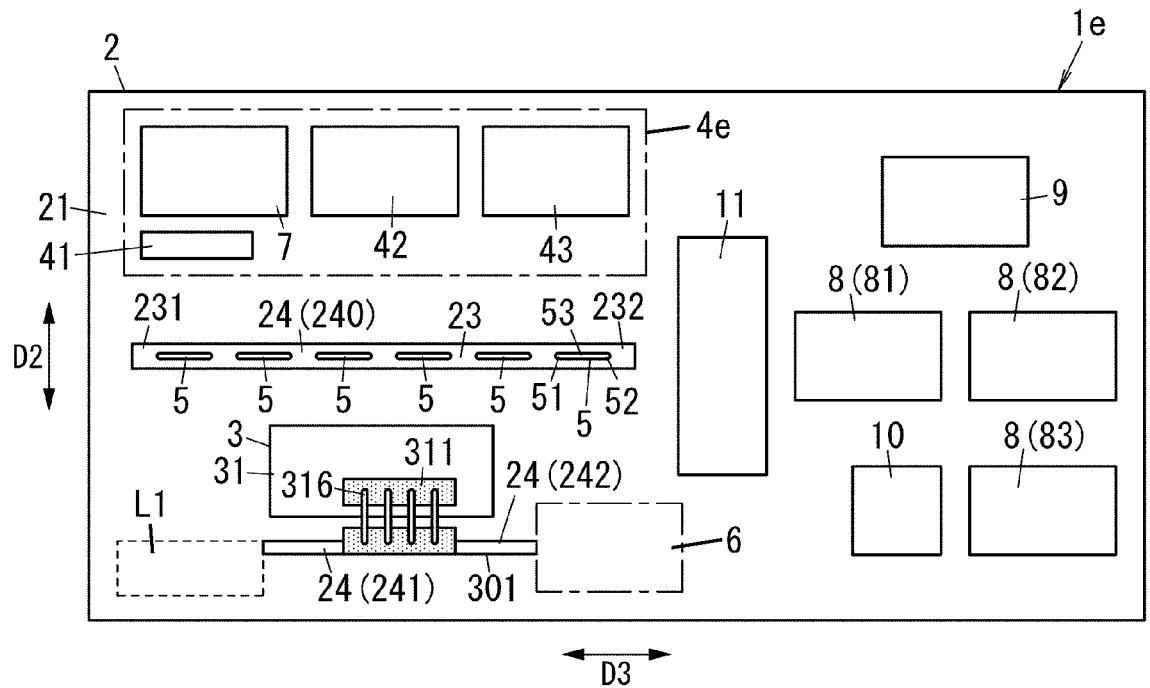
FIG. 8 is a layout diagram of a radio-frequency module according to Modification 4 of the embodiment of the present disclosure.

In the radio-frequency module 1 according to the embodiment, the second communication unit 4 transmits the second signal in the second frequency band higher than the first frequency band and at least partially overlapping a harmonic wave of the first signal. In contrast, in a radio-frequency module 1e according to Modification 4 of the embodiment, as illustrated in FIG. 8, a second communication unit 4e includes a receiving filter 42 and a low-noise amplifier 43, and receives a third signal in the second frequency band. For the radio-frequency module 1e according to Modification 4, components similar to those of the radio-frequency module 1 according to the embodiment will be designated by the same reference signs and will not be described in further detail.

The receiving filter 42 passes the third signal. The low-noise amplifier 43 has an input terminal, and an output terminal. The receiving filter 42 of the second communication unit 4e is connected to the input terminal of the low-noise amplifier 43. The low-noise amplifier 43 amplifies the third signal in the second frequency band inputted to its input terminal, and outputs the amplified third signal. In the radio-frequency module 1e according to Modification 4, the second communication unit 4e also includes the second power amplifier 41 and the second matching circuit 7 (transmitting filter), and performs both the transmission of the second signal and the reception of the third signal. In this regard, the radio-frequency module 1e according to Modification 4 is disposed in, for example, the front-end section of a cellular phone that supports carrier aggregation.

The radio-frequency module 1e according to Modification 4 includes the substrate 2, the first communication unit 3, the second communication unit 4, and at least one conductive wire 5. The substrate 2 includes the conductor unit 23 to which a constant potential is applied. The first communication unit 3 is disposed on the substrate 2. The first communication unit 3 transmits the first signal in the first frequency band. The second communication unit 4 is disposed on the substrate 2. The second communication unit 4 performs the transmission of the second signal in the second frequency band, and the reception of the third signal in the second frequency band. The second frequency band is higher than the first frequency band and at least partially overlaps a harmonic wave of the first signal. The conductive wire 5 has the first end 51 and the second end 52. The first and second ends 51 and 52 of the conductive wire 5 are connected to the conductor unit 23. The first communication unit 3 includes the power amplifier (first power amplifier 31) that amplifies a radio-frequency signal in the first frequency band, and outputs the amplified radio-frequency signal as the first signal. The second communication unit 4 includes at least one of the following components: the transmitting filter (second matching circuit 7) that passes the second signal; the receiving filter 42 that passes the third signal; or the low-noise amplifier 43 that amplifies the third signal. The conductive wire 5 is spaced apart from the first communication unit 3 and the second communication unit 4. The conductive wire 5 is located between the first power amplifier 31 of the first communication unit 3, and the transmitting filter (second matching circuit 7), the receiving filter 42, and the low-noise amplifier 43 of the second communication unit 4.

The above configuration of the radio-frequency module 1e according to Modification 4 helps ensure that, in transmitting the first signal from the first communication unit 3 through carrier aggregation, the degradation of the reception sensitivity does not occur as a result of, for example, a harmonic wave of the first signal passing through the receiving filter 42 of the second communication unit 4e into the low-noise amplifier 43, or leaking directly into the low-noise amplifier 43 without passing through the receiving filter 42. This leads to improved communication performance.

In the radio-frequency module 1e according to Modification 4, each conductive wire 5 is located between the first power amplifier 31 of the first communication unit 3, and the transmitting filter (second matching circuit 7), the receiving filter 42, and the low-noise amplifier 43 of the second communication unit 4e. However, this is not intended to be limiting. For example, each conductive wire 5 may be located between the first power amplifier 31 of the first communication unit 3, and at least one of the transmitting filter (second matching circuit 7), the receiving filter 42, or the low-noise amplifier 43 of the second communication unit 4e.

Although the radio-frequency module 1e according to Modification 4 performs both the transmission of the second signal and the reception of the third signal, the radio-frequency module 1e may not perform the transmission of the second signal. In this case, the radio-frequency module 1e according to Modification 4 does not need to include the second power amplifier 41 and the second matching circuit 7 (transmitting filter).

(5.5) Modification 5

The circuit configuration of a radio-frequency module 1f according to Modification 5, and the circuit configuration of a communication apparatus 400 including the radio-frequency module 1f will be described below with reference to FIGS. 9 to 11. For the radio-frequency module 1f according to Modification 5, components similar to those of the radio-frequency module 1 according to the embodiment will be designated by the same reference signs and will not be described in further detail.

The radio-frequency module 1f according to Modification 5 constitutes, for example, a radio-frequency front-end circuit 250 of a mobile communication apparatus (e.g., cellular phone) that supports multiband operation and carrier aggregation. The radio-frequency module 1f is a module capable of supporting a 2G mid-band, and a 4G low-band.

The communication apparatus 400 including the radio-frequency module 1f is capable of supporting carrier aggregation (downlink carrier aggregation) that simultaneously uses plural (two in Modification 5) frequency bands on the downlink. The communication apparatus 400 including the radio-frequency module 1f is also capable of supporting carrier aggregation (uplink carrier aggregation) that simultaneously uses plural (two in Modification 5) frequency bands on the uplink.

The 2G standard is, for example, GSM®. The 4G standard is, for example, 3GPP LTE. Examples of GSM® low-bands include GSM 850. Examples of GSM mid-bands include GSM 1800 and GSM 1900. The GSM-850 band has an uplink frequency range of 824.2 MHz to 848.8 MHz. The GSM-850 band has a downlink frequency range of 869.2 MHz to 893.8 MHz. The GSM-1900 band has an uplink frequency range of 1850 MHz to 1910 MHz. The GSM-1900 band has a downlink frequency range of 1930 MHz to 1990 MHz. Examples of 3GPP LTE standard low-bands include Band 8. Band 8 has a downlink frequency range of 925 MHz to 960 MHz. Band 8 has an uplink frequency range of 880 MHz to 915 MHz. Examples of 3GPP LTE mid-bands include Band 3. Band 3 has a downlink frequency range of 1805 MHz to 1880 MHz. Band 3 has an uplink frequency range of 1710 MHz to 1785 MHz.

Figure 9:
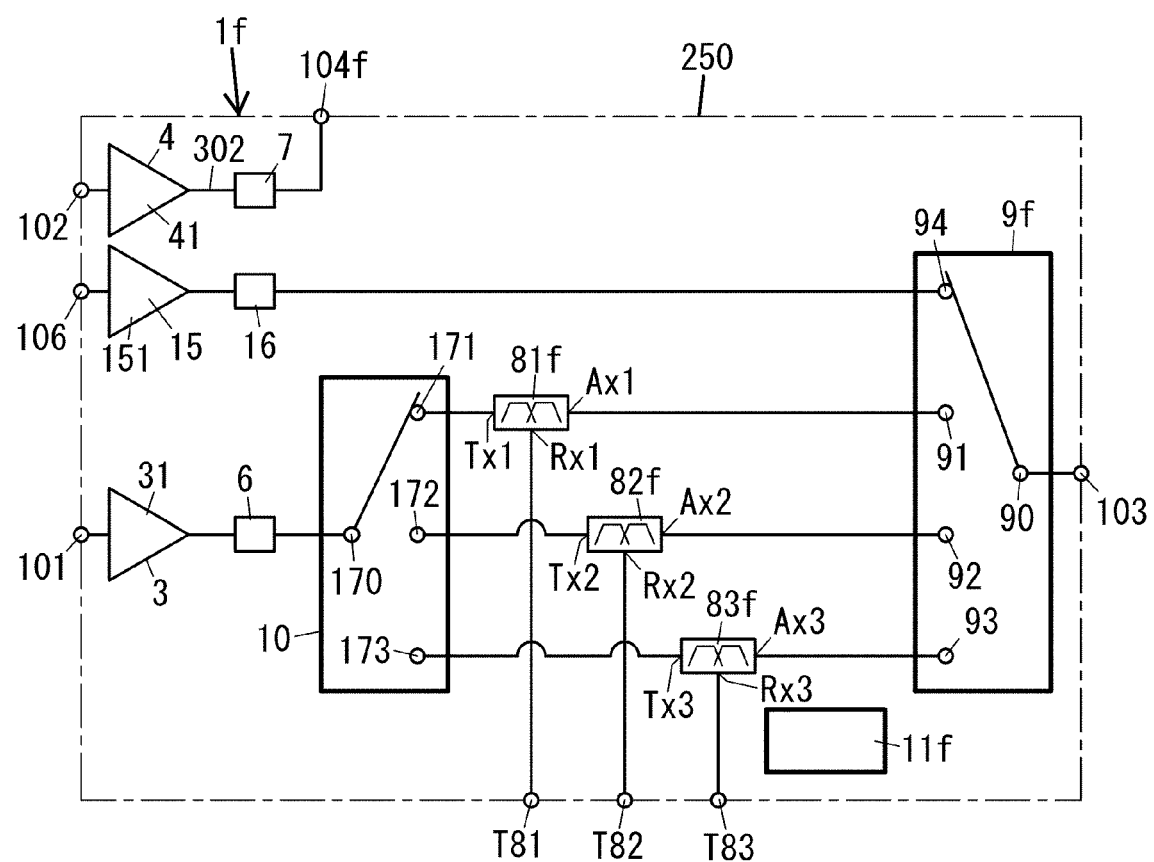
FIG. 9 is a layout diagram of a radio-frequency module according to Modification 5 of the embodiment of the present disclosure.

As illustrated in FIG. 9, the radio-frequency module 1f includes the first communication unit 3, the second communication unit 4, and a third communication unit 15. The first communication unit 3 includes the first power amplifier 31, and the first matching circuit 6. The second communication unit 4 includes the second power amplifier 41, and the second matching circuit 7. The third communication unit 15 includes a third power amplifier 151, and a third matching circuit 16.

The radio-frequency module 1f includes the first input terminal 101 (to be also referred to as the first low-band signal input terminal 101 hereinafter), the second input terminal 102 (to be also referred to as the mid-band signal input terminal 102 hereinafter), a third input terminal 106 (to be also referred to as the second low-band signal input terminal 106 hereinafter), the antenna terminal 103 (to be also referred to as the low-band antenna terminal 103 hereinafter), and an output terminal 104f (to be also referred to as the bypass terminal 104f hereinafter). The radio-frequency module 1f further includes plural low-band signal output terminals T81, T82, and T83.

The first power amplifier 31 amplifies an incoming radio-frequency signal in a 4G low-band (e.g., LTE Band 8), and outputs the amplified radio-frequency signal as a first signal.

The second power amplifier 41 amplifies an incoming radio-frequency signal in a 2G mid-band (e.g., GSM 1800 or GSM 1900), and outputs the amplified radio-frequency signal as a second signal.

The third power amplifier 151 amplifies an incoming radio-frequency signal in a 2G low-band (e.g., GSM 850), and outputs the amplified radio-frequency signal.

Figure 10:
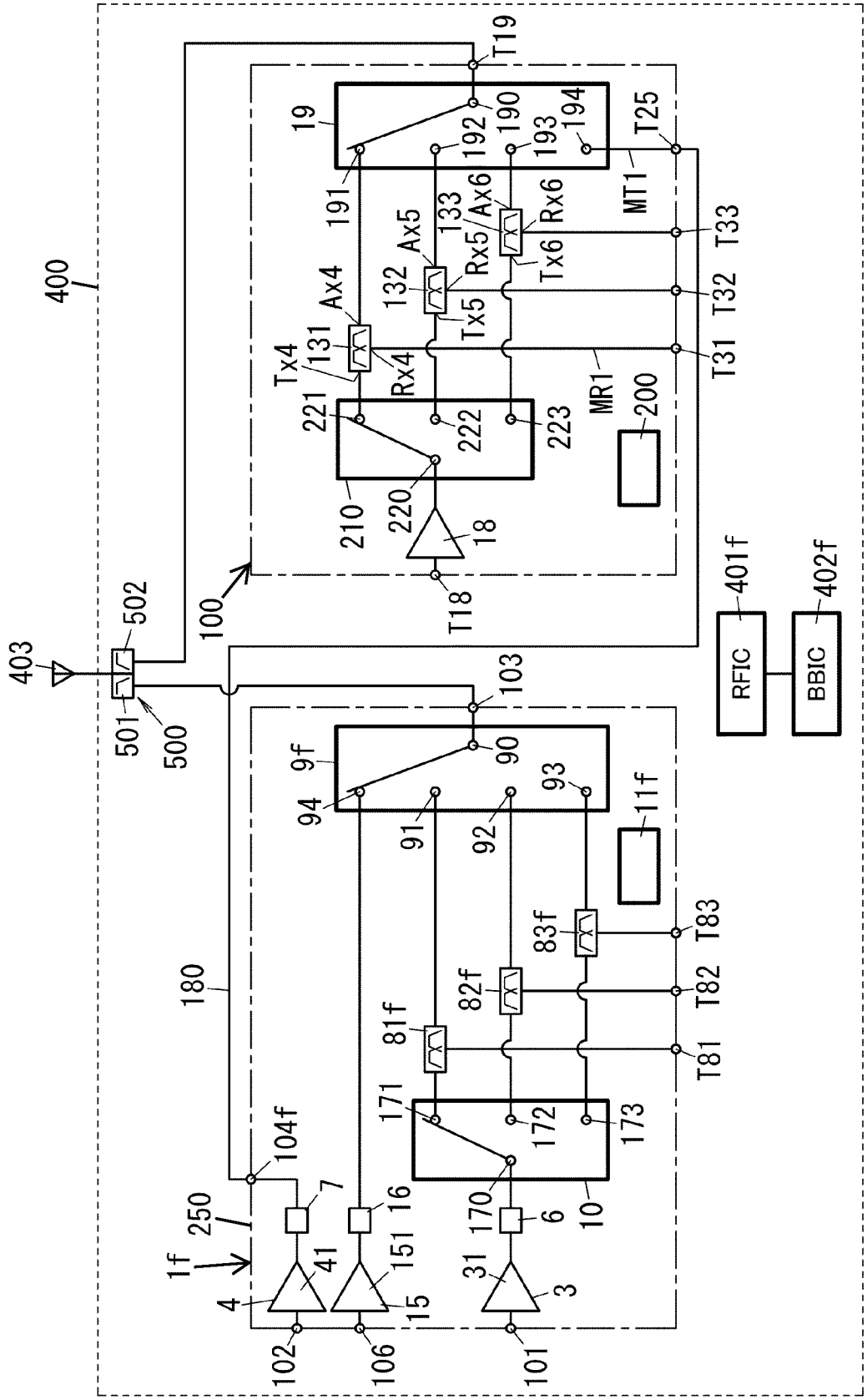
FIG. 10 is a circuit diagram of a communication apparatus including the radio-frequency module.
Figure 11:
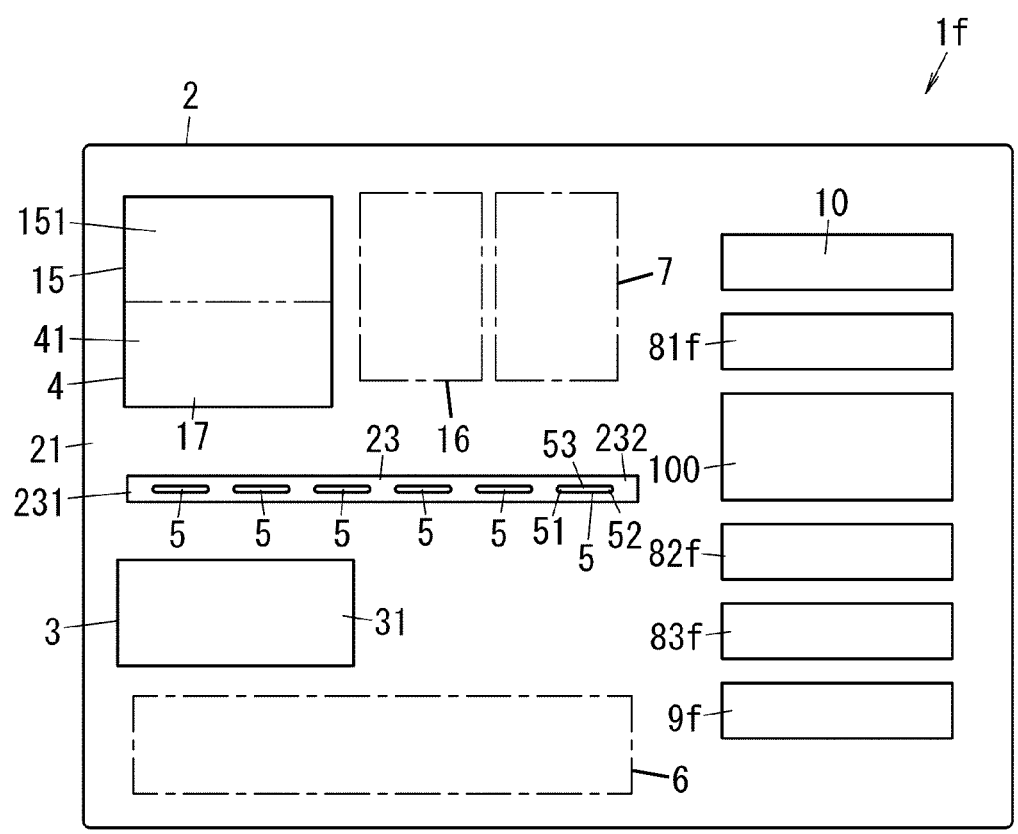
FIG. 11 is a layout diagram of the radio-frequency module.

The low-band antenna terminal 103 is electrically connected to the antenna 403 (see FIG. 10).

The bypass terminal 104f is electrically connected to the second power amplifier 41 via the second matching circuit 7 (transmitting filter).

A first switching circuit 9f (to be also referred to as the low-band antenna switch 9f hereinafter) is disposed between each of the first power amplifier 31 and the third power amplifier 151, and the low-band antenna terminal 103. The low-band antenna switch 9f includes one common terminal 90, and plural (four) selective terminals 91 to 94. The common terminal 90 of the low-band antenna switch 9f is connected to the low-band antenna terminal 103.

The first matching circuit 6 is disposed between the first power amplifier 31, and selective terminals 91 to 93 of the low-band antenna switch 9f. In this regard, the radio-frequency module 1f includes the following components between the first matching circuit 6 and the low-band antenna switch 9f: the second switching circuit 10 (to be also referred to as the low-band band-selector switch 10 hereinafter), and plural (three) low-band duplexers 81f, 82f, and 83f. Thus, more specifically, the first matching circuit 6 is disposed between the first power amplifier 31 and the low-band band-selector switch 10. The first matching circuit 6 is an impedance matching circuit used to match the output impedance of the circuit disposed before the first matching circuit 6, with the input impedance of the circuit disposed after the first matching circuit 6.

The second matching circuit 7 is disposed between the second power amplifier 41 and the bypass terminal 104f. The second matching circuit 7 is an impedance matching circuit used to match the output impedance of the circuit disposed before the second matching circuit 7, with the input impedance of the circuit disposed after the second matching circuit 7.

The third matching circuit 16 is disposed between the third power amplifier 151, and a selective terminal 94 of the low-band antenna switch 9f. The third matching circuit 16 is an impedance matching circuit used to match the output impedance of the circuit disposed before the third matching circuit 16, with the input impedance of the circuit disposed after the third matching circuit 16. The third matching circuit 16 includes plural inductors, and plural capacitors. The third matching circuit 16 doubles as a transmitting filter.

Each of the low-band duplexers 81f to 83f includes a receiving filter, and a transmitting filter. The receiving filter is a filter that passes signals in a receive frequency band, and attenuates signals outside the receive frequency band. The transmitting filter is a filter that passes signals in a transmit frequency band, and attenuates signals outside the transmit frequency band. Each of the receiving filter and the transmitting filter is, for example, a SAW filter, but may be a filter other than a SAW filter, such as a bulk acoustic wave (BAW) filter or a dielectric filter.

The low-band duplexers 81f to 83f have different transmit frequency bands, and different receive frequency bands.

The low-band duplexers 81f to 83f respectively have antenna-side terminals Ax1, Ax2, and Ax3, transmit terminals Tx1, Tx2, and Tx3, and receive terminals Rx1, Rx2, and Rx3. The respective antenna-side terminals Ax1 to Ax3 of the low-band duplexers 81f to 83f are connected to the low-band antenna switch 9f. For the low-band duplexers 81f to 83f, the output terminals of their respective receiving filters are used as the receive terminals Rx1, Rx2, and Rx3, and connected to the low-band signal output terminals T81, T82, and T83. For the low-band duplexers 81f to 83f, the input terminals of their respective transmitting filters are used as the transmit terminals Tx1, Tx2, and Tx3, and connected to selective terminals 171 to 173 of the low-band band-selector switch 10. For the low-band duplexers 81f to 83f, their respective terminals (ANT terminals) each connected to the output terminal of the corresponding transmitting filter and to the input terminal of the corresponding receiving filter are used as the antenna-side terminals Ax1, Ax2, and Ax3, and connected to the selective terminals 91 to 93 of the low-band antenna switch 9f.

The low-band antenna switch 9f is disposed between the antenna terminal 103, and the plural (three) low-band duplexers 81f to 83f. Of the four selective terminals 91 to 94 of the low-band antenna switch 9f, three selective terminals 91 to 93 are connected in a one-to-one relation to the low-band duplexers 81f to 83f, and the one remaining selective terminal 94 is connected to the third matching circuit 16.

The low-band band-selector switch 10 is disposed between the first power amplifier 31, and the transmit terminals Tx1 to Tx3 of the low-band duplexers 81f to 83f. The low-band band-selector switch 10 connects one of the low-band duplexers 81f to 83f to the first power amplifier 31.

The radio-frequency module 1f further includes a control circuit 11f. For example, the control circuit 11f receives a control signal from a baseband signal processing circuit 402f (see FIG. 10) and, based on the control signal, controls each of the first power amplifier 31, the second power amplifier 41, the third power amplifier 151, the low-band antenna switch 9f, and the low-band band-selector switch 10. The control circuit 11f is, for example, an integrated circuit (IC).

As illustrated in FIG. 10, the communication apparatus 400 includes a diplexer 500, the radio-frequency module 1f (to be also referred to as the first radio-frequency module 1f hereinafter), and a second radio-frequency module 100. The communication apparatus 400 further includes an RF signal processing circuit 401f, and the baseband signal processing circuit 402f.

The diplexer 500 includes a low-band filter 501 and a mid-band filter 502, and is connected to the antenna 403. The low-band filter 501 is a low pass filter. The mid-band filter 502 is a high pass filter.

The first radio-frequency module 1f is electrically connected to the low-band filter 501 of the diplexer 500. The first radio-frequency module 1f is thus electrically connected to the antenna 403 via the low-band filter 501.

The second radio-frequency module 100 is electrically connected to the mid-band filter 502 of the diplexer 500. The second radio-frequency module 100 is thus electrically connected to the antenna 403 via the mid-band filter 502.

The antenna terminal 103 of the first radio-frequency module 1f is connected to the low-band filter 501.

The following terminals of the first radio-frequency module 1f are connected to the RF signal processing circuit 401f: the second low-band signal input terminal 106, the mid-band signal input terminal 102, the first low-band signal input terminal 101, and the low-band signal output terminals T81, T82, and T83.

The second radio-frequency module 100 includes a mid-band antenna terminal T19, a fourth power amplifier 18, a mid-band signal input terminal T18, and a mid-band antenna switch 19. The second radio-frequency module 100 also includes a mid-band transmit path MT1, plural (three) mid-band duplexers 131, 132, and 133, a mid-band band selector switch 210, and plural (three) mid-band signal output terminals T31, T32, and T33. Further, the second radio-frequency module 100 includes a relay terminal T25 connected to the mid-band signal path MT1.

The mid-band antenna terminal T19 is connected to the mid-band filter 502 of the diplexer 500.

The fourth power amplifier 18 is connected to the mid-band signal input terminal T18. The fourth power amplifier 18 amplifies an incoming radio-frequency signal in a 4G mid-band, and outputs the amplified radio-frequency signal.

The mid-band antenna switch 19 is disposed between the fourth power amplifier 18 and the mid-band antenna terminal T19. More specifically, the mid-band antenna switch 19 is disposed between the mid-band antenna terminal T19 and the plural (three) mid-band duplexers 131 to 133. The mid-band antenna switch 19 includes one common terminal 190, and plural (four) selective terminals 191 to 194. The common terminal 190 of the mid-band antenna switch 19 is connected to the mid-band antenna terminal T19. Of the four selective terminals 191 to 194 of the mid-band antenna switch 19, three selective terminals 191 to 193 are connected in a one-to-one relation to the mid-band duplexers 131 to 133, and the one remaining selective terminal 194 is connected to the relay terminal T25 through the mid-band transmit path MT1. The mid-band antenna switch 19 is, for example, a switching integrated circuit (IC). The isolation of the mid-band antenna switch 19 is, for example, about 20 dB to about 30 dB.

The mid-band signal path MT1 is connected to the mid-band antenna switch 19, and connected to the bypass terminal 104f of the first radio-frequency module 1f. More specifically, the mid-band signal path MT1 is connected to the bypass terminal 104f of the first radio-frequency module 1f via the relay terminal T25.

The plural (three) mid-band duplexers 131, 132, and 133 respectively include antenna-side terminals Ax4, Ax5, and Ax6, transmit terminals Tx4, Tx5, and Tx6, and receive terminals Rx4, Rx5, and Rx6. The respective antenna-side terminals Ax4 to Ax6 of the mid-band duplexers 131 to 133 are connected to the mid-band antenna switch 19. For the mid-band duplexers 131 to 133, the output terminals of their respective receiving filters are used as the receive terminals Rx4, Rx5, and Rx6, and connected to the mid-band signal output terminals T31, T32, and T33. For the mid-band duplexers 131 to 133, the input terminals of their respective transmitting filters are used as the transmit terminals Tx4, Tx5, and Tx6, and connected to selective terminals 221 to 223 of the mid-band band selector switch 210. For the mid-band duplexers 131 to 133, their respective terminals (ANT terminals) each connected to the output terminal of the corresponding transmitting filter and to the input terminal of the corresponding receiving filter are used as the antenna-side terminals Ax4, Ax5, and Ax6, and connected to the selective terminals 191 to 193 of the mid-band antenna switch 19.

The mid-band band selector switch 210 is disposed between the fourth power amplifier 18, and the transmit terminals Tx4, Tx5, and Tx6 of the mid-band duplexers 131, 132, and 133. The mid-band band selector switch 210 connects one of the mid-band duplexers 131 to 133 to the fourth power amplifier 18.

The plural (three) mid-band signal output terminals T31, T32, and T33 are respectively connected in a one-to-one relation to the receive terminals Rx4, Rx5, and Rx6 of the plural (three) mid-band duplexers 131, 132, and 133.

The RF signal processing circuit 401f is connected to the first radio-frequency module 1f and the second radio-frequency module 100. More specifically, the RF signal processing circuit 401f is connected to the following terminals of the first radio-frequency module 1f: the second low-band signal input terminal 106, the mid-band signal input terminal 102, the first low-band signal input terminal 101, and the low-band signal output terminals T81, T82, and T83. Further, the RF signal processing circuit 401f is connected to the following terminals of the second radio-frequency module 100: the mid-band signal input terminal T18, and the mid-band signal output terminals T31, T32, and T33.

The RF signal processing circuit 401f is, for example, an RFIC. The RF signal processing circuit 401f applies signal processing to a radio-frequency signal (receive signal) outputted from each of the low-band signal output terminals T81, T82, and T83 and the mid-band signal output terminals T31, T32, and T33. The RF signal processing circuit 401f applies signal processing such as down-conversion to a radio-frequency signal (receive signal) inputted from the antenna 403 via the first radio-frequency module 1f or the second radio-frequency module 100, and outputs the resulting receive signal to the baseband signal processing circuit 402f.

The baseband signal processing circuit 402f is, for example, a BBIC. The receive signal processed by the baseband signal processing circuit 402f is used, for example, as an image signal for image display or as a voice signal for conversation.

The RF signal processing circuit 401f applies, for example, signal processing such as up-conversion to a radio-frequency signal (transmit signal) outputted from the baseband signal processing circuit 402f, and outputs the resulting transmit signal (radio-frequency signal) to the first radio-frequency module 1f or the second radio-frequency module 100. The baseband signal processing circuit 402f applies, for example, the predetermined signal processing to a transmit signal provided from outside the communication apparatus 400.

The communication apparatus 400 further includes a bypass path 180, and a control circuit 200.

The bypass path 180 electrically connects the bypass terminal 104f with the mid-band signal path MT1 (relay terminal T25 connected to the mid-band signal path MT1). The bypass path 180 includes, for example, an interconnection conductor of a printed circuit board on which the first radio-frequency module 1f and the second radio-frequency module 100 are mounted. In this case, the communication apparatus 400 includes the printed circuit board as its component.

The control circuit 200 switches the mid-band antenna switch 19 such that one of the mid-band duplexers 131 to 133 and the mid-band signal path MT1 is connected to the mid-band filter 502 of the diplexer 500.

One (mid-band duplexer 131) of the mid-band duplexers 131, 132, and 133 is a duplexer that supports 4G, for example, LTE Band 3. In the second radio-frequency module 100, the signal path between the mid-band antenna switch 19 and the mid-band signal output terminal T31 constitutes a mid-band receive path MR1. The communication apparatus 400 is thus capable of supporting downlink carrier aggregation of Band 8 and Band 3. The mid-band duplexer 132 is a duplexer that supports 4G, for example, LTE Band 12. The mid-band duplexer 133 is a duplexer that supports 4G, for example, LTE Band 20.

As described above, the radio-frequency module 1f according to Modification 5 includes the first power amplifier 31, the second power amplifier 41, and the third power amplifier 151. The radio-frequency module 1f also includes the low-band antenna terminal 103, the bypass terminal 104f, the low-band band-selector switch 10, the low-band antenna switch 9f, the third matching circuit 16, the second matching circuit 7, and the first matching circuit 6. Further, the radio-frequency module 1f includes the substrate 2.

In the radio-frequency module 1f, the second power amplifier 41 and the third power amplifier 151 are integrated into a single semiconductor chip 17. The first power amplifier 31 is implemented in a semiconductor chip different from the semiconductor chip 17.

In the radio-frequency module 1f, the first power amplifier 31, the second power amplifier 41, the third power amplifier 151, the first matching circuit 6, the second matching circuit 7, the third matching circuit 16, the low-band duplexers 81f to 83f, the low-band antenna switch 9f, the low-band band-selector switch 10, and the control circuit 11f are mounted on the substrate 2.

The radio-frequency module 1f according to Modification 5 includes the substrate 2, the first communication unit 3, the second communication unit 4, and at least one conductive wire 5. The substrate 2 includes the conductor unit 23 to which a constant potential is applied. The first communication unit 3 is disposed on the substrate 2. The first communication unit 3 transmits the first signal in the first frequency band. The second communication unit 4 is disposed on the substrate 2. The second communication unit 4 performs at least one of the transmission of the second signal in the second frequency band, or the reception of the third signal in the second frequency band. The second frequency band is higher than the first frequency band and at least partially overlaps a harmonic wave of the first signal. The conductive wire 5 has the first end 51 and the second end 52. The first and second ends 51 and 52 of the conductive wire 5 are connected to the conductor unit 23. The first communication unit 3 includes the power amplifier (first power amplifier 31) that amplifies a radio-frequency signal in the first frequency band, and outputs the amplified radio-frequency signal as the first signal. The second communication unit 4 includes the transmitting filter (second matching circuit 7) that passes the second signal. The conductive wire 5 is spaced apart from the first communication unit 3 and the second communication unit 4. The conductive wires 5 is located between the power amplifier (first power amplifier 31) of the first communication unit 3, and the transmitting filter (second matching circuit 7) of the second communication unit 4.

The above configuration of the radio-frequency module 1f according to Modification 5 helps ensure that, for example, in transmitting the first signal from the first communication unit 3, a harmonic wave of the first signal does not pass through the second matching circuit 7 (transmitting filter) of the second communication unit 4 to exit from the output terminal 104f. This leads to improved communication performance. More specifically, the configuration of the radio-frequency module 1f according to Modification 5 helps ensure that a harmonic wave of the first signal on the output side of the first power amplifier 31, which is a 4G low-band power amplifier, does not pass (leak) to the output side of the second power amplifier 41, which is a 2G mid-band power amplifier. This allows for improved communication performance.

In the radio-frequency module 1f according to Modification 5, the second communication unit 4 transmits the second signal, the first frequency band is an LTE low-band, and the second frequency band is a 2G mid-band. This configuration of the radio-frequency module 1f according to Modification 5 helps prevent a harmonic wave of the first signal in the LTE low-band from passing (leaking) into the second communication unit 4, which supports the 2G mid-band.

In the radio-frequency module 1f according to Modification 5, the conductive wire 5 is located between the first group and the second group. The first group includes the first power amplifier 31 and the first matching circuit 6 of the first communication unit 3. The second group includes the second power amplifier 41 and the second matching circuit 7 (transmitting filter) of the second communication unit 4. This configuration of the radio-frequency module 1f according to Modification 5 helps ensure that, in transmitting the first signal in, for example, Band 8 by the use of the first power amplifier 31 that supports a 4G low-band, a harmonic wave of the first signal radiated from at least one inductor of the first matching circuit 6 does not pass (leak) into at least one inductor of the second matching circuit 7 connected to the second power amplifier 41 that supports a 2G mid-band. In other words, the above configuration of the radio-frequency module 1f helps minimize entry (leaking-in) of a harmonic wave of the first signal due to magnetic coupling between at least one inductor of the first matching circuit 6 and at least one inductor of the second matching circuit 7.

The second communication unit 4 of the radio-frequency module 1f according to Modification 5 includes the power amplifier (second power amplifier 41) that amplifies a radio-frequency signal in the second frequency band, and outputs the amplified radio-frequency signal as the second signal. The radio-frequency module 1f further includes the low-band antenna terminal 103 that outputs the first signal outputted from the power amplifier (first power amplifier 31) of the first communication unit 3, and the bypass terminal 104f that outputs the second signal outputted from the power amplifier (second power amplifier 41) of the second communication unit 4. As a result, with the radio-frequency module 1f according to Modification 5, the second signal outputted from the power amplifier (second power amplifier 41) of the second communication unit 4 can be outputted from the output terminal 104f.

In this regard, the radio-frequency module 1f according to Modification 5 further includes the low-band antenna switch 9f, and the respective receiving filters of the low-band duplexers 81f to 83f. The low-band antenna switch 9f is disposed between each of the third power amplifier 151 and the first power amplifier 31, and the low-band antenna terminal 103. Each receiving filter is disposed between the low-band antenna switch 9f and the first matching circuit 6, and supports a 4G low-band. The above configuration of the communication apparatus 400 including the radio-frequency module 1f according to Modification 5 helps ensure that, for example, for two-downlink carrier aggregation of Band 8 and Band 3, a harmonic wave of Band 8 does not leak into the mid-band duplexer 131 of the second radio-frequency module 100 via the bypass terminal 104f, thus allowing for improved communication performance. The combination of two bands in two-downlink carrier aggregation may be a combination other than the combination of Band 8 and Band 3.

The communication apparatus 400 does not simultaneously perform transmission on a 2G mid-band and reception on a 4G mid-band. The respective 4G-compliant components of the radio-frequency module 1f and communication apparatus 400 may be 5G-compliant.

(5.6) Other Modifications

Although the radio-frequency module 1 according to the embodiment transmits the first signal in the first frequency band, this is not intended to be limiting. The radio-frequency module 1 may perform both transmission of the first signal in the first frequency band and reception of a fourth signal in the first frequency band. If the first communication unit 3 is to receive such a fourth signal, the first communication unit 3 includes, for example, a low-noise amplifier that amplifies the fourth signal.

The first frequency band of the radio-frequency module 1 may be any frequency band falling within the frequency range of, for example, about 600 MHz to about 950 MHz. Although the second frequency band of the radio-frequency module 1 includes the GSM® 1800-MHz band, this is not intended to be limiting. The second frequency band may include, for example, an LTE mid-band (1427 MHz to 2200 MHz), or may include an LTE high-band (2300 MHz to 2690 MHz).

Examples of the communication standards employed by the radio-frequency module 1 may not only include LTE and GSM® but may also include Bluetooth® and W-CDMA®.

Although the foregoing description of the radio-frequency module 1 is directed to the case in which the conductive wires 5 are arranged in the third direction D3 orthogonal to the first and second directions first D1 and D2, this is not intended to be limiting. For example, the conductive wires 5 may be arranged in the second direction D2.

Although the foregoing description of the radio-frequency module 1 is directed to the case in which a single conductor unit 23, which is exposed on the first major side 21 of the substrate 2, includes plural conductive wires 5 directly connected to the conductor unit 23, this is not intended to be limiting. For example, the number of conductive wires 5 connected to the single conductor unit 23 may not necessarily be plural but may be one.

The first choke coil L1 and the second choke coil L2 may not necessarily be inductors incorporated within the substrate 2 but may be surface-mount inductors (e.g., chip inductors) mounted on the substrate 2.

The first power amplifier 31 may include plural (e.g., two or three) amplifier transistors connected in plural stages, with the transistor 310 being the amplifier transistor in the final stage.

The second power amplifier 41 may include plural (e.g., two or three) amplifier transistors connected in plural stages, with the transistor 410 being the amplifier transistor in the final stage.

The substrate 2 may not necessarily have a substantially rectangular shape in a plan view but may have a substantially non-rectangular polygonal shape or a substantially circular shape in a plan view.

Each first conductive layer 24 of the substrate 2 may not necessarily be made of Cu but may be made of, for example, an alloy. Each first conductive layer 24 may not necessarily have a single-layer structure but may have a multilayer structure.

The substrate 2 may not necessarily be a printed circuit board but may be, for example, a multilayer ceramic substrate.

Each filter 8 of the radio-frequency module 1 may not necessarily be a SAW filter but may be, for example, a BAW filter or a dielectric filter.

For the radio-frequency module 1, if, for example, the antenna 403 connected to the antenna terminal 103 doubles as a receiving antenna, the filters 8 may be duplexers. Each duplexer includes a transmitting filter, and a receiving filter. The transmitting filter passes signals in a transmit frequency band (pass band including a transmit communication band), and attenuates signals outside the transmit frequency band. The receiving filter passes signals in a receive frequency band (pass band including a receive communication band in the first frequency band), and attenuates signals outside the receive frequency band. The duplexers each have a different transmit frequency band and a different receive frequency band. For each duplexer, the input terminal of its transmitting filter is used as a transmit terminal (Tx terminal) for receiving a transmit signal (first signal), and connected to a selective terminal of the second switching circuit 10. For each duplexer, the output terminal of its receiving filter is used as a receive terminal (Rx terminal) for outputting a receive signal, and connected to a receive terminal provided to the substrate 2. Further, for each duplexer, its terminal (ANT terminal) connected to the output terminal of the transmitting filter and to the input terminal of the receiving filter is connected to a selective terminal of the first switching circuit 9. The second switching circuit 10 connects the output end of the first power amplifier 31 to one of the transmit terminals of the respective transmitting filters of the duplexers. If each of the filters 8 is implemented as a duplexer, the radio-frequency module 1 may further include a low-noise amplifier, and a third switching circuit that connects the input end of the low-noise amplifier to one of the respective receive terminals of the duplexers. The third switching circuit may be controlled by the control circuit 11.

Each semiconductor switch in each of the first switching circuit 9 and the second switching circuit 10 may not necessarily be an FET but may be, for example, a micro-electro-mechanical systems (MEMS) switch or a bipolar transistor.

The radio-frequency module 1 may not necessarily include plural filters 8 but may include only one filter 8. In this case, the radio-frequency module 1 does not need to include the first switching circuit 9 and the second switching circuit 10.

The above-mentioned embodiment or other such implementation represents only one example of various embodiments or implementations of the present disclosure. Various changes or modifications may be made to the embodiment or other such implementation in accordance with the design or other requirements as long as the object of the disclosure can be achieved.

CONCLUDING REMARKS

It is apparent from the foregoing description of the embodiment or other such implementation that the present disclosure encompasses the aspects described below.

A radio-frequency module (1, 1a, 1b, 1c, 1e, 1f) according to a first aspect includes a substrate (2), a first communication unit (3), a second communication unit (4, 4e), and at least one conductive wire (5). The substrate (2) includes a conductor unit (23) to which a constant potential is applied. The first communication unit (3) is disposed on the substrate (2). The first communication unit (3) transmits a first signal in a first frequency band. The second communication unit (4, 4e) is disposed on the substrate (2). The second communication unit (4, 4e) performs at least one of transmission of a second signal in a second frequency band or reception of a third signal in the second frequency band. The second frequency band is higher than the first frequency band and at least partially overlaps a harmonic wave of the first signal. The at least one conductive wire (5) has a first end (51) and a second end (52). The first end (51) and the second end (52) of the at least one conductive wire (5) are connected to the conductor unit (23). The first communication unit (3) includes a power amplifier (first power amplifier 31). The power amplifier (first power amplifier 31) amplifies a radio-frequency signal in the first frequency band, and outputs the amplified radio-frequency signal as the first signal. The second communication unit (4, 4e) includes at least one of a transmitting filter (second matching circuit 7), a receiving filter (42), or a low-noise amplifier (43). The transmitting filter (second matching circuit 7) passes the second signal. The receiving filter (42) passes the third signal. The low-noise amplifier (43) amplifies the third signal. The at least one conductive wire (5) is spaced apart from the first communication unit (3) and the second communication unit (4). The at least one conductive wire (5) is located between the power amplifier of the first communication unit (3), and the at least one of the transmitting filter (second matching circuit 7), the receiving filter (42), or the low-noise amplifier (43) of the second communication unit (4).

The above configuration of the radio-frequency module (1, 1a, 1b, 1c, 1e, 1f) according to the first aspect ensures that a harmonic wave of the first signal radiated from the first communication unit (3) toward the second communication unit (4, 4e) when the first communication unit (3) transmits the first signal can be attenuated by the conductive wire (5). Therefore, the configuration of the radio-frequency module (1, 1a, 1b, 1c, 1e, 1f) according to the first aspect makes it possible to reduce the influence that a harmonic wave of the first signal exerts on the second communication unit (4, 4e) at the time when the first communication unit (3) transmits the first signal, thus allowing for improved communication performance.

In a radio-frequency module (1e) according to a second aspect, in the first aspect, the second communication unit (4e) includes a receiving filter (42), and a low-noise amplifier (43), and the second communication unit (4e) receives the third signal when the first communication unit (3) is transmitting the first signal.

The above configuration of the radio-frequency module (1e) according to the second aspect helps ensure that, in transmitting the first signal from the first communication unit (3) through carrier aggregation, the degradation of the reception sensitivity does not occur as a result of, for example, a harmonic wave of the first signal passing through the receiving filter (42) of the second communication unit (4e) into the low-noise amplifier (43), or leaking directly into the low-noise amplifier (43) without passing through the receiving filter (42). This leads to improved communication performance.

In a radio-frequency module (1f) according to the third aspect, in the first aspect, the second communication unit (4) transmits the second signal, the first frequency band is an LTE low-band, and the second frequency band is a 2G mid-band.

The above configuration of the radio-frequency module (1f) according to the third aspect helps prevent a harmonic wave of the first signal in the LTE low-band from passing (leaking) into the second communication unit (4) that supports the 2G mid-band.

In a radio-frequency module (1f) according to the fourth aspect, in the third aspect, the second communication unit (4) includes a power amplifier (second power amplifier 41). The power amplifier (second power amplifier 41) amplifies a radio-frequency signal in the second frequency band, and outputs the amplified radio-frequency signal as the second signal. The radio-frequency module (1f) further includes a low-band antenna terminal (103) that outputs the first signal outputted from the power amplifier (first power amplifier 31) of the first communication unit (3), and a bypass terminal (104f) that outputs the second signal outputted from the power amplifier (second power amplifier 41) of the second communication unit (4).

With the above configuration of the radio-frequency module (1f) according to the fourth aspect, the second signal outputted from the power amplifier (second power amplifier 41) of the second communication unit (4) can be outputted from the bypass terminal (104f).

In a radio-frequency module (1, 1a, 1b, 1c, 1e, 1f) according to a fifth aspect, in any one of the first to fourth aspects, the conductor unit (23) is disposed between the power amplifier (first power amplifier 31) of the first communication unit (3), and the at least one of the transmitting filter (first matching circuit 6), the receiving filter (42), or the low-noise amplifier (43) of the second communication unit (4, 4e), over a greater area than the power amplifier (first power amplifier 31) of the first communication unit (3).

The above configuration of the radio-frequency module (1, 1a, 1b, 1c, 1e, 1f) according to the fifth aspect makes it possible to further reduce the influence that a harmonic wave of the first signal exerts on the second communication unit (4, 4e) at the time when the first communication unit (3) transmits the first signal, thus allowing for further improved communication performance.

In a radio-frequency module (1, 1a, 1b, 1c, 1e, 1f) according to a sixth aspect, in any one of the first to fifth aspects, the at least one conductive wire (5) includes plural conductive wires (5).

The above configuration of the radio-frequency module (1, 1a, 1b, 1c, 1e, 1f) according to the sixth aspect makes it possible to further attenuate a harmonic wave of the first signal radiated from the first communication unit (3) toward the second communication unit (4, 4e). The above configuration of the radio-frequency module (1, 1a, 1b, 1c, 1e, 1f) according to the sixth aspect also has another advantage in that, as compared with a configuration with only one conductive wire (5), the distance in the thickness direction of the substrate (2) between the substrate (2) and the apex portion (53) of each conductive wire (5) can be reduced, thus making it possible to reduce the profile of the radio-frequency module (1, 1a, 1b, 1c, 1e, 1f) in the thickness direction of the substrate (2).

In a radio-frequency module (1e) according to a seventh aspect, in the sixth aspect, the plural conductive wires (5) are disposed in a direction transverse to a direction in which the power amplifier (first power amplifier 31) of the first communication unit (3), and the at least one of the transmitting filter (second matching circuit 7), the receiving filter (42), or the low-noise amplifier (43) of the second communication unit (4e) are arranged.

The above configuration of the radio-frequency module (1e) according to the seventh aspect helps ensure that a harmonic wave of the first signal radiated from the first communication unit (3) toward the second communication unit (4e) does not leak into the low-noise amplifier (43) via the receiving filter (42) of the second communication unit (4e), or does not leak directly into the low-noise amplifier (43) without passing through the receiving filter (42).

In a radio-frequency module (1, 1a, 1b, 1c, 1e, 1f) according to an eighth aspect, in any one of the first to seventh aspects, the second communication unit (4, 4e) includes a power amplifier (second power amplifier 41). The power amplifier (second power amplifier 41) amplifies a radio-frequency signal in the second frequency band, and outputs the amplified radio-frequency signal as the second signal. The radio-frequency module (1, 1a, 1b, 1c, 1e, 1f) further includes a bias circuit (first bias circuit 12) that supplies the power amplifier (first power amplifier 31) of the first communication unit (3) with an operating voltage (Vcc1) for the power amplifier (first power amplifier 31), a first matching circuit (6) connected to the output end (output end 311) of the power amplifier (first power amplifier 31) of the first communication unit (3), and a second matching circuit (7) connected to the output end of the power amplifier (second power amplifier 41) of the second communication unit (4, 4e). The transmitting filter of the second communication unit (4, 4e) is formed by the second matching circuit (7) connected to the output end of the power amplifier (second power amplifier 41) of the second communication unit (4, 4e). The bias circuit includes a choke coil (first choke coil L1) connected to the output end (output end 311) of the power amplifier (first power amplifier 31). The conductive wire (5) is located between a first group and a second group. The first group includes the choke coil (first choke coil L1), and the power amplifier (first power amplifier 31) and the first matching circuit (6) of the first communication unit (3). The second group includes the power amplifier (second power amplifier 41) and the transmitting filter (second matching circuit 7) of the second communication unit (4, 4e).

The above configuration of the radio-frequency module (1, 1a, 1b, 1c) according to the eighth aspect helps more effectively ensure that a harmonic wave of the first signal radiated from the vicinity of the output end (output end 311) of the power amplifier (first power amplifier 31) does not leak toward the second communication unit (4, 4e).

In a radio-frequency module (1, 1a, 1b, 1c, 1e, 1f) according to a ninth aspect, in any one of the first to eighth aspects, the first frequency band is located in a frequency range of about 600 MHz to about 950 MHz.

In a radio-frequency module (1f) according to a tenth aspect, in the fourth aspect, the first frequency band includes a 4G LTE low-band, and the second frequency band includes a 2G 1800-MHz band.

In a radio-frequency module (1f) according to an eleventh aspect, in the fourth aspect, the first frequency band includes a 4G LTE low-band, and the second frequency band includes a 4G LTE mid-band.

In a radio-frequency module according to a twelfth aspect, in the fourth aspect, the first frequency band includes at least one of LTE Band 8 and LTE Band 20, and the second frequency band includes at least one of LTE Band 3 and GSM® Band 1900 PCS.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
   a substrate including a conductor unit to which a constant potential is applied;
   a first communication unit disposed on the substrate, the first communication unit transmitting a first signal in a first frequency band;
   a second communication unit disposed on the substrate, the second communication unit performing at least one of transmission of a second signal in a second frequency band or reception of a third signal in the second frequency band, the second frequency band being higher than the first frequency band and at least partially overlapping a harmonic wave of the first signal; and
   at least one conductive wire having a first end and a second end, the first end and the second end being connected to the conductor unit,
   wherein the first communication unit includes a first power amplifier, the first power amplifier amplifying a radio-frequency signal in the first frequency band and outputting the amplified radio-frequency signal as the first signal,
   wherein the second communication unit includes at least one of a transmitting filter, a receiving filter, or a low-noise amplifier, the transmitting filter passing the second signal, the receiving filter passing the third signal, the low-noise amplifier amplifying the third signal,
   wherein the at least one conductive wire is spaced apart from the first communication unit and the second communication unit, the at least one conductive wire being located between the first power amplifier of the first communication unit and the at least one of the transmitting filter, the receiving filter, or the low-noise amplifier of the second communication unit, and
   wherein, in plan view, the conductor unit is disposed between the first power amplifier of the first communication unit and the at least one of the transmitting filter, the receiving filter, or the low-noise amplifier of the second communication unit, over a greater area than the first power amplifier of the first communication unit in a direction transverse to a direction in which the first power amplifier of the first communication unit and second communication unit are arranged.

2. The radio-frequency module according to claim 1, wherein the second communication unit includes the receiving filter and the low-noise amplifier, and wherein the second communication unit receives the third signal when the first communication unit is transmitting the first signal.

3. The radio-frequency module according to claim 1, wherein the second communication unit transmits the second signal, wherein the first frequency band is an LTE low band, and wherein the second frequency band is a 2G mid-band.

4. The radio-frequency module according to claim 3, wherein the second communication unit includes a second power amplifier, the second power amplifier amplifying a radio-frequency signal in the second frequency band and outputting the amplified radio-frequency signal as the second signal, and wherein the radio-frequency module further includes a low-band antenna terminal that outputs the first signal outputted from the first power amplifier of the first communication unit, and a bypass terminal that outputs the second signal outputted from the second power amplifier of the second communication unit.

5. The radio-frequency module according to claim 1, wherein the conductor unit is disposed between the first power amplifier of the first communication unit and the at least one of the transmitting filter, the receiving filter, or the low-noise amplifier of the second communication unit, over a greater area than the first power amplifier of the first communication unit.

6. The radio-frequency module according to claim 2, wherein the conductor unit is disposed between the first power amplifier of the first communication unit and the at least one of the transmitting filter, the receiving filter, or the low-noise amplifier of the second communication unit, over a greater area than the first power amplifier of the first communication unit.

7. The radio-frequency module according to claim 3, wherein the conductor unit is disposed between the first power amplifier of the first communication unit and the at least one of the transmitting filter, the receiving filter, or the low-noise amplifier of the second communication unit, over a greater area than the first power amplifier of the first communication unit.

8. The radio-frequency module according to claim 4, wherein the conductor unit is disposed between the first power amplifier of the first communication unit and the at least one of the transmitting filter, the receiving filter, or the low-noise amplifier of the second communication unit, over a greater area than the first power amplifier of the first communication unit.

9. The radio-frequency module according to claim 1, wherein the at least one conductive wire includes a plurality of conductive wires.

10. The radio-frequency module according to claim 2, wherein the at least one conductive wire includes a plurality of conductive wires.

11. The radio-frequency module according to claim 3, wherein the at least one conductive wire includes a plurality of conductive wires.

12. The radio-frequency module according to claim 9, wherein the plurality of conductive wires are disposed in a direction transverse to a direction in which the first power amplifier of the first communication unit and the at least one of the transmitting filter, the receiving filter, or the low-noise amplifier of the second communication unit are arranged.

13. A radio-frequency module comprising:
a substrate including a conductor unit to which a constant potential is applied;
a first communication unit disposed on the substrate, the first communication unit transmitting a first signal in a first frequency band;
a second communication unit disposed on the substrate, the second communication unit performing at least one of transmission of a second signal in a second frequency band or reception of a third signal in the second frequency band, the second frequency band being higher than the first frequency band and at least partially overlapping a harmonic wave of the first signal; and
at least one conductive wire having a first end and a second end, the first end and the second end being connected to the conductor unit,
wherein the first communication unit includes a first power amplifier, the first power amplifier amplifying a radio-frequency signal in the first frequency band and outputting the amplified radio-frequency signal as the first signal,
wherein the second communication unit includes at least one of a transmitting filter, a receiving filter, or a low-noise amplifier, the transmitting filter passing the second signal, the receiving filter passing the third signal, the low-noise amplifier amplifying the third signal,
wherein the at least one conductive wire is spaced apart from the first communication unit and the second communication unit, the at least one conductive wire being located between the first power amplifier of the first communication unit and the at least one of the transmitting filter, the receiving filter, or the low-noise amplifier of the second communication unit,
wherein the second communication unit includes a second power amplifier, the second power amplifier amplifying a radio-frequency signal in the second frequency band and outputting the amplified radio-frequency signal as the second signal,
wherein the radio-frequency module further comprises
a bias circuit that supplies the first power amplifier of the first communication unit with an operating voltage for the first power amplifier, and
a first matching circuit connected to an output end of the first power amplifier of the first communication unit,
wherein the transmitting filter of the second communication unit is a second matching circuit, the second matching circuit being connected to an output end of the second power amplifier of the second communication unit,
wherein the bias circuit includes a choke coil connected to the output end of the first power amplifier of the first communication unit, and
wherein the conductive wire is located between a first group and a second group, the first group including the choke coil and the first power amplifier and the first matching circuit of the first communication unit, the second group including the second power amplifier and the transmitting filter of the second communication unit.

14. The radio-frequency module according to claim 2,
wherein the second communication unit includes a second power amplifier, the second power amplifier amplifying a radio-frequency signal in the second frequency band and outputting the amplified radio-frequency signal as the second signal,
wherein the radio-frequency module further comprises
a bias circuit that supplies the first power amplifier of the first communication unit with an operating voltage for the first power amplifier, and
a first matching circuit connected to an output end of the first power amplifier of the first communication unit,
wherein the transmitting filter of the second communication unit is a second matching circuit, the second matching circuit being connected to an output end of the second power amplifier of the second communication unit,
wherein the bias circuit includes a choke coil connected to the output end of the first power amplifier of the first communication unit, and
wherein the conductive wire is located between a first group and a second group, the first group including the choke coil and the first power amplifier and the first matching circuit of the first communication unit, the second group including the second power amplifier and the transmitting filter of the second communication unit.

15. The radio-frequency module according to claim 1,
wherein the first frequency band is located in a frequency range of about 600 MHz or higher to about 950 MHz or lower.

16. The radio-frequency module according to claim 1,
wherein the first frequency band includes a 4G LTE low-band, and
wherein the second frequency band includes a 2G 1800-MHz band.

17. The radio-frequency module according to claim 1,
wherein the first frequency band includes a 4G LTE low-band, and
wherein the second frequency band includes a 4G LTE mid-band.

18. The radio-frequency module according to claim 1,
wherein the first frequency band includes at least one of LTE Band 8 or LTE Band 20, and
wherein the second frequency band includes at least one of LTE Band 3 or GSM® Band 1900 PCS.

19. The radio-frequency module according to claim 2,
wherein the first frequency band includes at least one of LTE Band 8 or LTE Band 20, and
wherein the second frequency band includes at least one of LTE Band 3 or GSM® Band 1900 PCS.

* * * * *